United States Patent
Davis et al.

(10) Patent No.: US 7,520,286 B2
(45) Date of Patent: Apr. 21, 2009

(54) APPARATUS AND METHOD FOR CLEANING AND DRYING A CONTAINER FOR SEMICONDUCTOR WORKPIECES

(75) Inventors: Jeffry Alan Davis, Kalispell, MT (US); Randy A. Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 490 days.

(21) Appl. No.: 11/294,921

(22) Filed: Dec. 5, 2005

(65) Prior Publication Data

US 2007/0125404 A1    Jun. 7, 2007

(51) Int. Cl.
B08B 3/02 (2006.01)

(52) U.S. Cl. .................. 134/166 R; 134/153; 414/937; 414/940

(58) Field of Classification Search ................. 414/937, 414/940, 217, 217.1, 416.03; 134/166 R, 134/169 R, 153, 148, 18, 32, 33; 250/559.04, 250/559.4, 559.33, 559.36, 221, 223 R
See application file for complete search history.

(56) References Cited

U.S. PATENT DOCUMENTS

| | | |
|---|---|---|
| 5,085,560 A | 2/1992 | Thompson et al. |
| 5,174,045 A | 12/1992 | Thompson et al. |
| 5,224,503 A | 7/1993 | Thompson et al. |
| 5,238,500 A | 8/1993 | Bergman |
| 5,332,445 A | 7/1994 | Bergman |
| 5,562,113 A | 10/1996 | Thompson et al. |
| 5,738,128 A | 4/1998 | Thompson et al. |
| 5,784,797 A | 7/1998 | Curtis et al. |
| 6,015,462 A | 1/2000 | Doolittle |
| 6,030,208 A | 2/2000 | Williams et al. |
| 6,191,388 B1 | 2/2001 | Cleaver et al. |
| 6,270,647 B1 | 8/2001 | Graham et al. |
| 6,273,110 B1 | 8/2001 | Davis et al. |
| 6,318,951 B1 | 11/2001 | Schmidt et al. |
| 6,322,119 B1 | 11/2001 | Schmidt et al. |

(Continued)

FOREIGN PATENT DOCUMENTS

JP    H04-048622    4/1992

Primary Examiner—Michael Barr
Assistant Examiner—Saeed T Chaudhry
(74) Attorney, Agent, or Firm—Perkins Coie LLP; Kenneth H. Ohriner; Craig E. Bohn

(57) ABSTRACT

The invention provides an apparatus for cleaning and drying a container for semiconductor workpieces. The apparatus comprises a load port with a fixture that receives a dirty container and delivers it to a deck assembly with a carrier that removably receives the container for further handling. While the container is received by the carrier, a robot with a first end effector removes the container door and places it on a portion of the carrier. The robot includes a second end effector that engages the carrier and elevates the carrier and container for insertion into a process chamber. The process chamber includes a rotor with at least one receptacle wherein the rotor is rotated to create both high pressure and low pressure regions. Once the container and carrier are loaded into the rotor, the rotor is rotated and means for cleaning injects a processing fluid onto the container and carrier. After a rinse stage and while the rotor is rotating, the means for drying delivers air across the container and carrier. Upon completion of the drying stage, the robot removes both the container and the carrier from the process chamber and reassembles the door to the container such that container can be returned to use.

35 Claims, 34 Drawing Sheets

U.S. PATENT DOCUMENTS

| | | |
|---|---|---|
| 6,351,682 B1 | 2/2002 | Doolittle |
| 6,370,791 B1 | 4/2002 | Weaver et al. |
| 6,423,642 B1 | 7/2002 | Peace et al. |
| 6,439,824 B1 | 8/2002 | Harris et al. |
| 6,536,131 B2 | 3/2003 | Davis |
| 6,569,297 B2 | 5/2003 | Wilson et al. |
| 6,572,320 B2 | 6/2003 | Davis |
| 6,575,689 B2 | 6/2003 | Harris et al. |
| 6,602,383 B1 | 8/2003 | Batz, Jr. et al. |
| 6,660,137 B2 | 12/2003 | Wilson et al. |
| 6,692,613 B2 | 2/2004 | Peace et al. |
| 6,695,914 B2 | 2/2004 | Curtis et al. |
| 6,717,171 B2 | 4/2004 | Harris et al. |
| 6,723,174 B2 | 4/2004 | Nelson et al. |
| 6,736,148 B2 | 5/2004 | Davis et al. |
| 6,794,291 B2 | 9/2004 | Peace et al. |
| 6,854,473 B2 | 2/2005 | Hanson et al. |
| 6,866,460 B2 | 3/2005 | Davis et al. |
| 6,878,955 B2 | 4/2005 | Harris et al. |
| 6,900,132 B2 | 5/2005 | Thompson et al. |
| 6,904,920 B2 | 6/2005 | Bexten et al. |
| 6,921,467 B2 | 7/2005 | Hanson et al. |
| 6,921,468 B2 | 7/2005 | Graham et al. |
| 6,930,046 B2 | 8/2005 | Hanson et al. |
| 6,942,738 B1 | 9/2005 | Nelson et al. |
| 2002/0100495 A1* | 8/2002 | Bexten et al. .................. 134/18 |
| 2002/0179863 A1* | 12/2002 | Harris et al. ............. 250/559.4 |
| 2007/0125404 A1 | 6/2007 | Davis et al. |

* cited by examiner

APPARATUS AND METHOD FOR CLEANING AND DRYING A CONTAINER FOR SEMICONDUCTOR WORKPIECES

CROSS-REFERENCE TO RELATED APPLICATIONS

Not applicable.

FEDERALLY SPONSORED RESEARCH OR DEVELOPMENT

Not applicable.

TECHNICAL FIELD

The invention relates to an apparatus and method for cleaning and drying a container for semiconductor workpieces. The apparatus includes a container carrier, a robot that handles the container and the carrier, and a process chamber with a rotor that receives both the container and carrier and then is rotated to create high and low pressure areas for cleaning and drying the container.

BACKGROUND OF THE INVENTION

Microelectronic devices are used in a wide array of products. These devices, including but not limited to memory and microprocessor chips, have been used as components of computers, telephones, sound equipment, and other electronic consumer products. Over the years, manufacturers have improved such microelectronic devices. For example, manufacturers have invented new microprocessor chips with faster processing speeds, and with other improved characteristics, all at a lower cost and price to the end user. These lower prices have made possible the use of such microelectronic devices in products in which they had not previously been used, or in which they had been only sparingly used, such as appliances, motor vehicles, and even lower priced goods, such as toys and games. The increased use of microelectronic devices in such products has enabled their manufacturers to lower the products' cost, provide the products with new features, and increased the products' reliability. The increased speed, versatility, and cost-effectiveness of these microelectronic devices have even facilitated the creation of entirely new types of products.

A major factor in the development of these improved microelectronic devices has been the equipment and methods used in their manufacture. The semiconductor manufacturing industry is constantly seeking to improve the processes and machines used to manufacture microelectronic circuits and components, such as the manufacture of integrated circuits from semiconductor wafers or workpieces. The objectives of many of these improved processes and machines include: decreasing the amount of time required to process a wafer to form the desired integrated circuits; increasing the yield of usable integrated circuits per wafer by, for example, decreasing contamination of the wafer during processing; reducing the time and/or number of steps required to create the desired integrated circuits; improving the uniformity and efficiency of processes used to create the desired integrated circuits; and reducing the costs of manufacture.

In order to decrease wafer contamination, many manufacturing processes are carried out in a self-contained clean environment, or fab, as it is commonly known in the semiconductor industry. Additionally, semiconductor workpieces are often housed in a container (e.g., a cassette or front-opening unified pod (FOUP)) and moved from machine-to-machine, or to-and-from the fab during the manufacturing process. The containers for housing semiconductor workpieces often become contaminated with impurities such as dust, dirt, material particles (e.g., metal particles or photoresist particles), and even process chemicals. Thus, in order to decrease wafer contamination and increase integrated circuit manufacturing yields, the containers must be cleaned from batch-to-batch. Existing cleaning equipment requires a human operator to load and unload the containers in batches. Human operators, however, increase the likelihood of contamination and reduce efficiency thereby increasing the overall process time required to clean the containers.

The present invention provides an automated apparatus for cleaning semiconductor workpiece containers. Because human operators are not required to load and unload the apparatus of the present invention, the likelihood of contamination is decreased and the overall cleaning process time is reduced, thereby increasing process efficiencies. A full discussion of the features and advantages of the present invention is deferred to the following detailed description, which proceeds with reference to the accompanying drawings.

SUMMARY OF THE INVENTION

The present invention provides an apparatus and an automated method for cleaning semiconductor workpiece containers. The apparatus and method of the present invention eliminate the need for human operators, thereby reducing the likelihood of contaminating the semiconductor workpieces and reducing overall process times. The apparatus of the present invention includes a loading port that supplies containers to and receives containers from a carrier assembly. The carrier assembly, which serves as a transfer point for both processed and unprocessed containers, includes a carrier (or a plurality of carriers) for receiving the containers. A robot opens each container and places the opened containers and the carrier into a process chamber. The process chamber is driven by a rotor, creating a high pressure zone and a low pressure zone. A process fluid for cleaning the container is introduced into the process chamber and the pressure differential between the low pressure zone and the high pressure zone facilitates distribution of the cleaning fluid throughout the process chamber to clean the containers. The apparatus also includes a drying system that directs air into the process chamber for drying the containers. Once dried, the robot removes the containers from the process chamber and places them onto the carrier assembly, whereupon the robot reassembles the container. The load port removes the cleaned containers and supplies additional containers to be cleaned.

In one embodiment, the apparatus of the present invention includes two process chambers, each having two or more receptacles for receiving, cleaning and drying a plurality of containers. In order to provide a continuous, automated process, the apparatus includes more carriers than carrier stations, and the start time of each process chamber is staggered. As such, when one process chamber completes the cleaning and drying steps, the robot will unload clean containers and load dirty containers, which have been docked in the additional carriers. During this unload/load phase of the first process chamber, the second process chamber continues processing until the cleaning and drying steps are completed. The robot then repeats its unloading and loading functions with respect to the second process chamber. completes its processing steps. Because the load port is continuously removing the clean containers and supplying dirty containers, the process chambers have a ready supply of containers for cleaning. In this manner, the apparatus of the present invention provides a continuous, automated method for cleaning semiconductor workpiece containers with improved processing efficiency and decreased likelihood of wafer contamination.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings in which.

DETAILED DESCRIPTION

Figure 1:
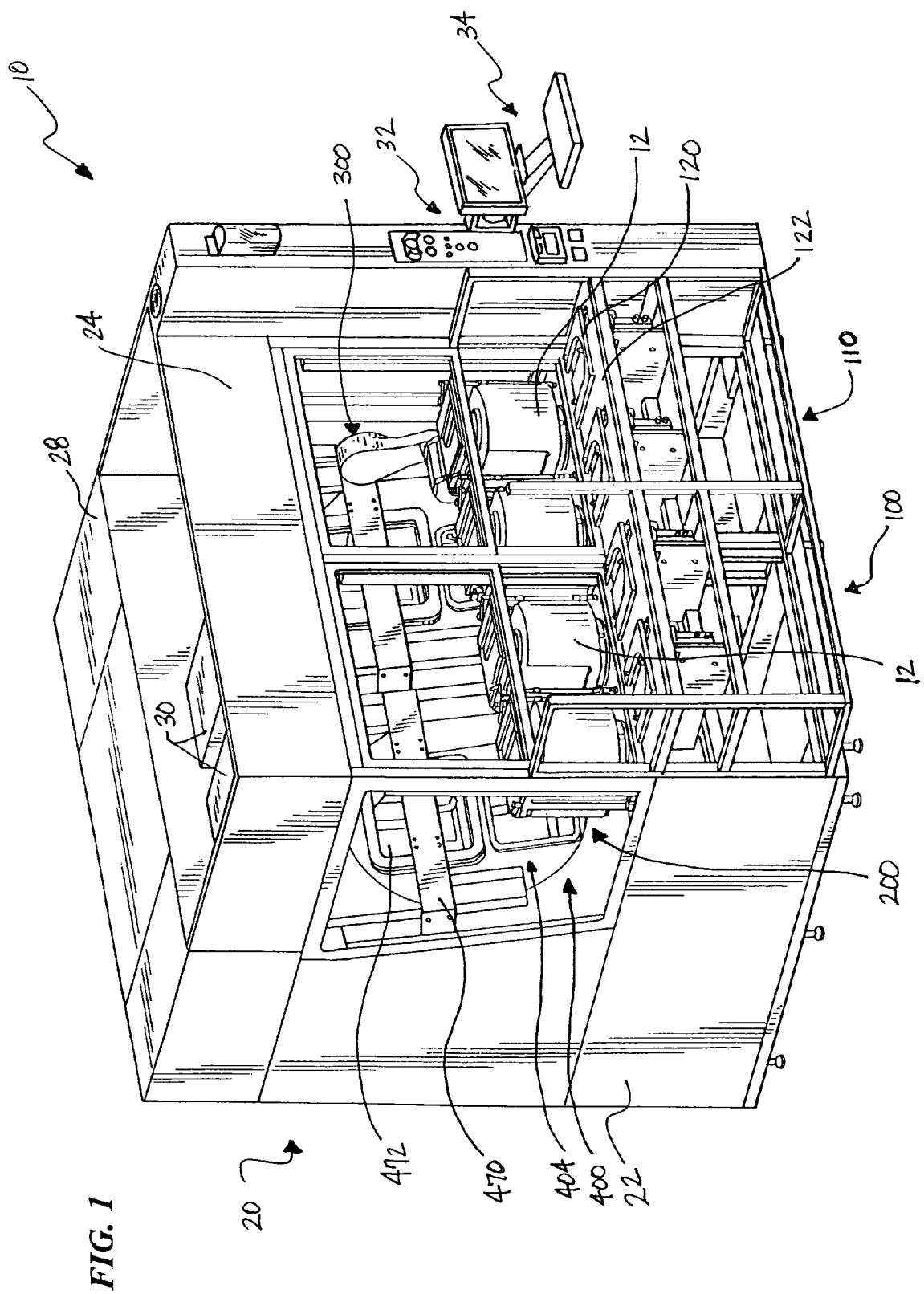
FIG. 1 is a perspective view of a cleaner apparatus of the invention, showing the cleaner apparatus in an open position.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

An apparatus 10 for cleaning and drying a container 12 for semiconductor workpieces is depicted in FIGS. 1-33. The cleaner apparatus 10 generally includes a load port 100, a carrier assembly 200, a robot 300 and a process chamber 400. As explained in detail below, the cleaner apparatus 10 provides an automated, high-throughput process for cleaning and drying containers 12 that are delivered to the apparatus 10 either manually or via a delivery tool. The container 12 (see FIGS. 8-10), or front-opening unified pod (FOUP) as it is commonly referred to in the semiconductor manufacturing industry, removably stores a number of conventional semiconductor workpieces or wafers in a vertical stack. In general terms, a semiconductor workpiece (not shown) is a thin slice of material, such as silicon crystal, upon which microcircuits are formed. The workpiece ranges in diameter from 25 to 300 mm and may have a thickness in a range of 100-650 microns, or even less than 100 microns.

Figure 2:
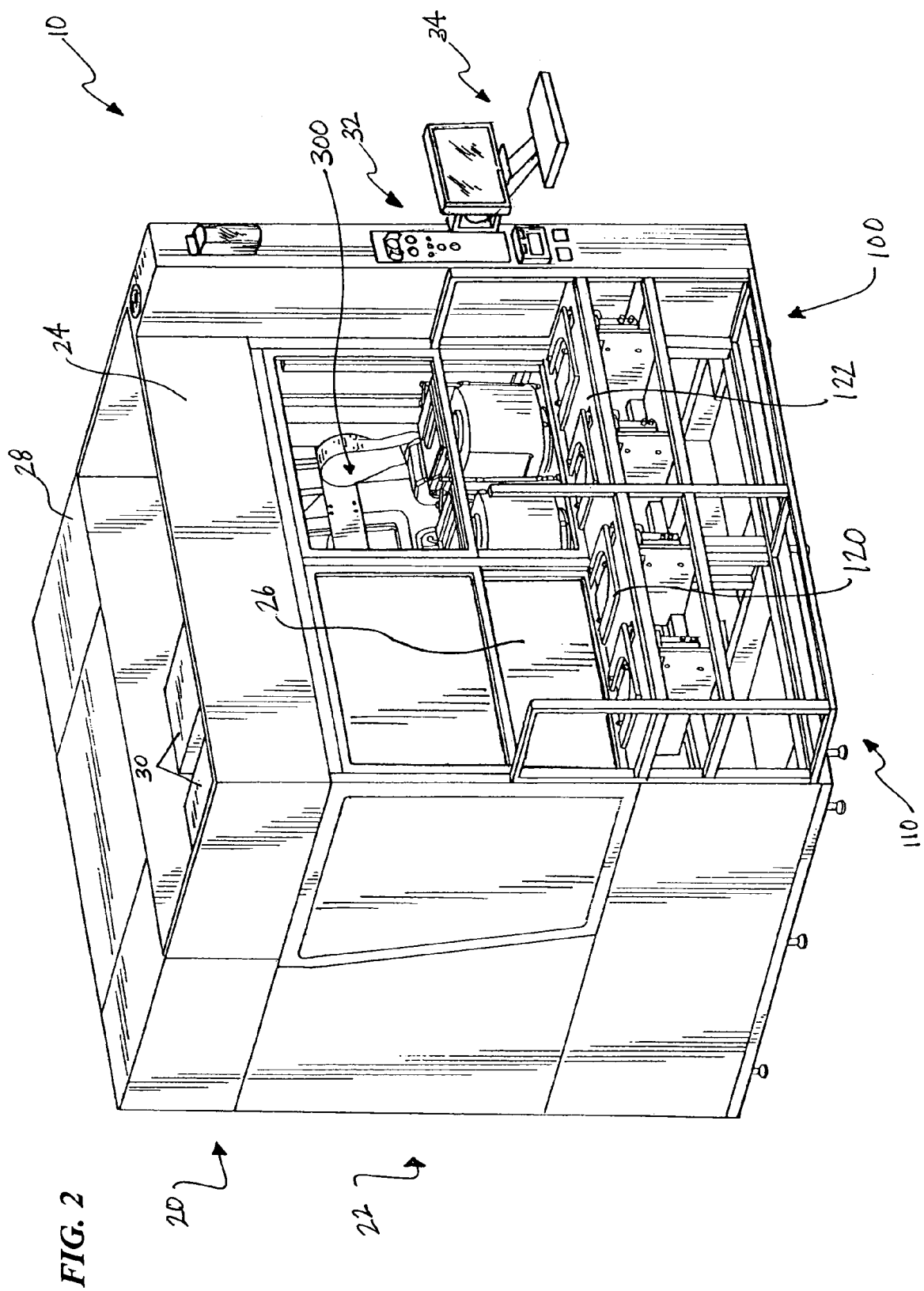
FIG. 2 is a perspective view of the cleaner apparatus, showing the cleaner apparatus in a partially open position.

Referring to FIGS. 1 and 2, the cleaner apparatus 10 includes an enclosure 20 defined by a wall arrangement 22. The wall arrangement 22 includes a front wall 24 with at least one door 26 that opens to provide access to the components within the enclosure 20. FIG. 1 shows the cleaner apparatus 10 in an open position, wherein the doors 26 and a side wall are removed for illustrative purposes. FIG. 2 shows the apparatus 10 in an intermediate position, wherein one of the doors 26 is opened to provide access to one of the process chambers 400. Preferably, the doors 26 are independently operated for sequential processing of multiple containers 12 within the process chambers 400. While the cleaner apparatus 10 is shown as having two distinct process chambers 400, the apparatus 10 can be configured with a single process chamber 400 or more than two process chambers 400.

The enclosure 20 is configured to provide a clean internal environment, such as a Class 1 environment, for the processing of the container 12. A top wall 28 of the arrangement 22 has wall panels 30, with two panels 30 being removed from the enclosure 20 in FIG. 1. Referring to FIG. 2, a control panel 32 is operably attached to the enclosure 20, and includes a user interface 34 to monitor and/or interface with the cleaner apparatus 10. In one embodiment, the user interface 34 can include a keyboard and a display screen to control and/or adjust the operation of the cleaner apparatus 10. In another embodiment of the apparatus 10, the user interface 34 is a graphical user interface with input and control features, such as a touch screen. The control panel 32 and/or the user interface 34 are linked with a number of sensor assemblies that report the position and status of the container 12 and/or carrier 212. The user interface 34 is electronically linked with an internal controller (not shown) that controls the operation of the apparatus 10, including the storage of programs or recipes where the process variables of time, temperature, pressure, rotor r.p.m. and/or direction of rotation are specified. The end-user may define new programs for the controller to execute or run factory specified programs.

According to an aspect of the invention and as shown in FIGS. 1-4, the load port 100 is positioned external to the enclosure 20 but near the doors 26. As explained in greater detail below, the load port 100 is configured to supply containers 12 through the door 26 to the carrier assembly 200, and to receive containers 12 from the carrier assembly 200 that have been cleaned and dried in the process chamber 400. The load port 100 includes a frame assembly 110 formed from numerous frame members 112, an input door 114 operably connected to the assembly 110, and a loader assembly 116 that supplies containers 12, to and receives containers 12 from, the carrier assembly 200.

Figure 3A:
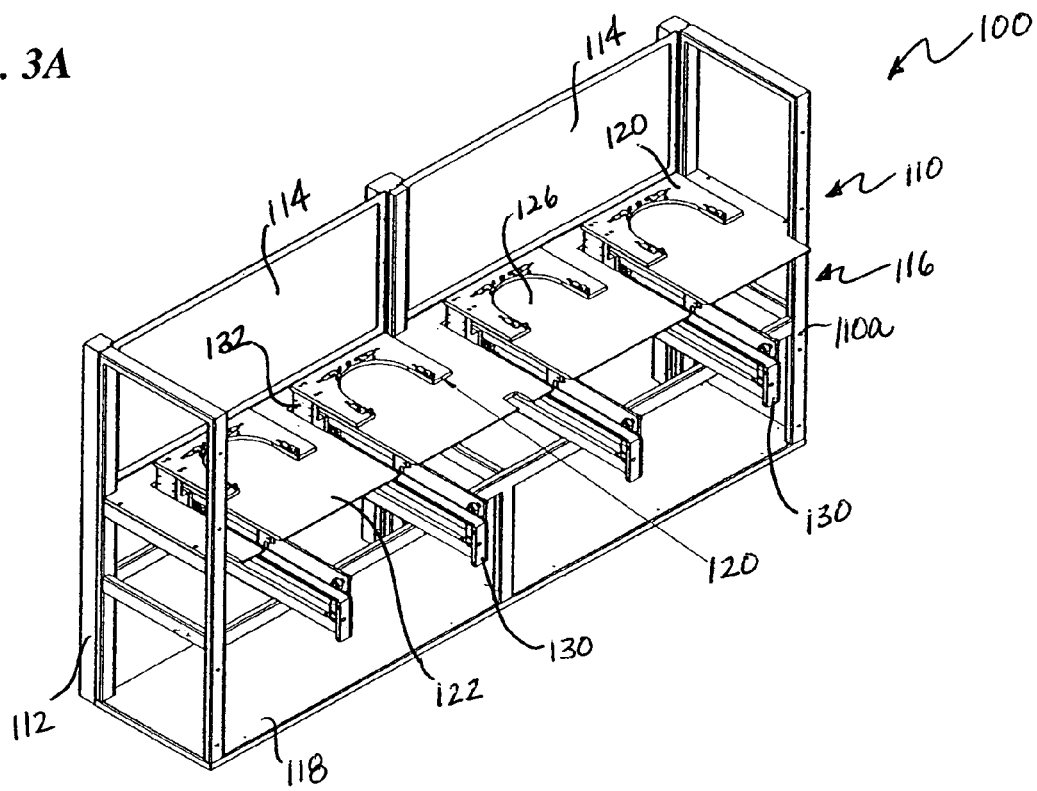
FIG. 3A is a front perspective view of a load port of the cleaner apparatus.
Figure 3B:
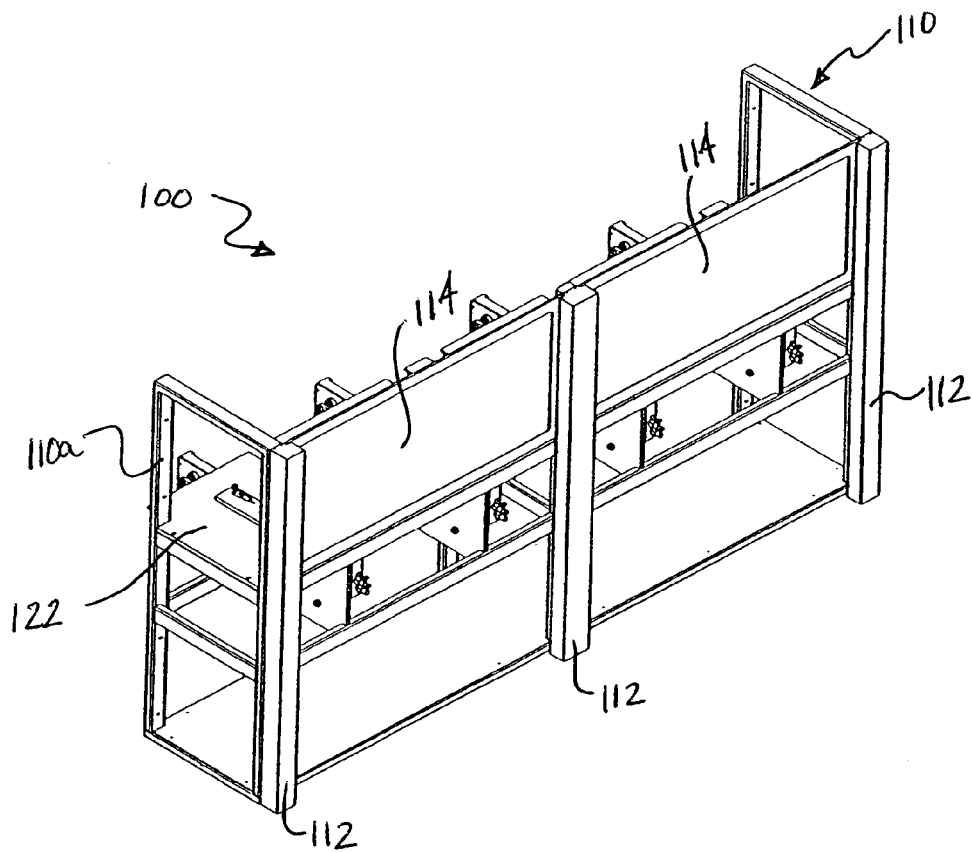
FIG. 3B is a rear perspective view of a load port of the cleaner apparatus.
Figure 4:
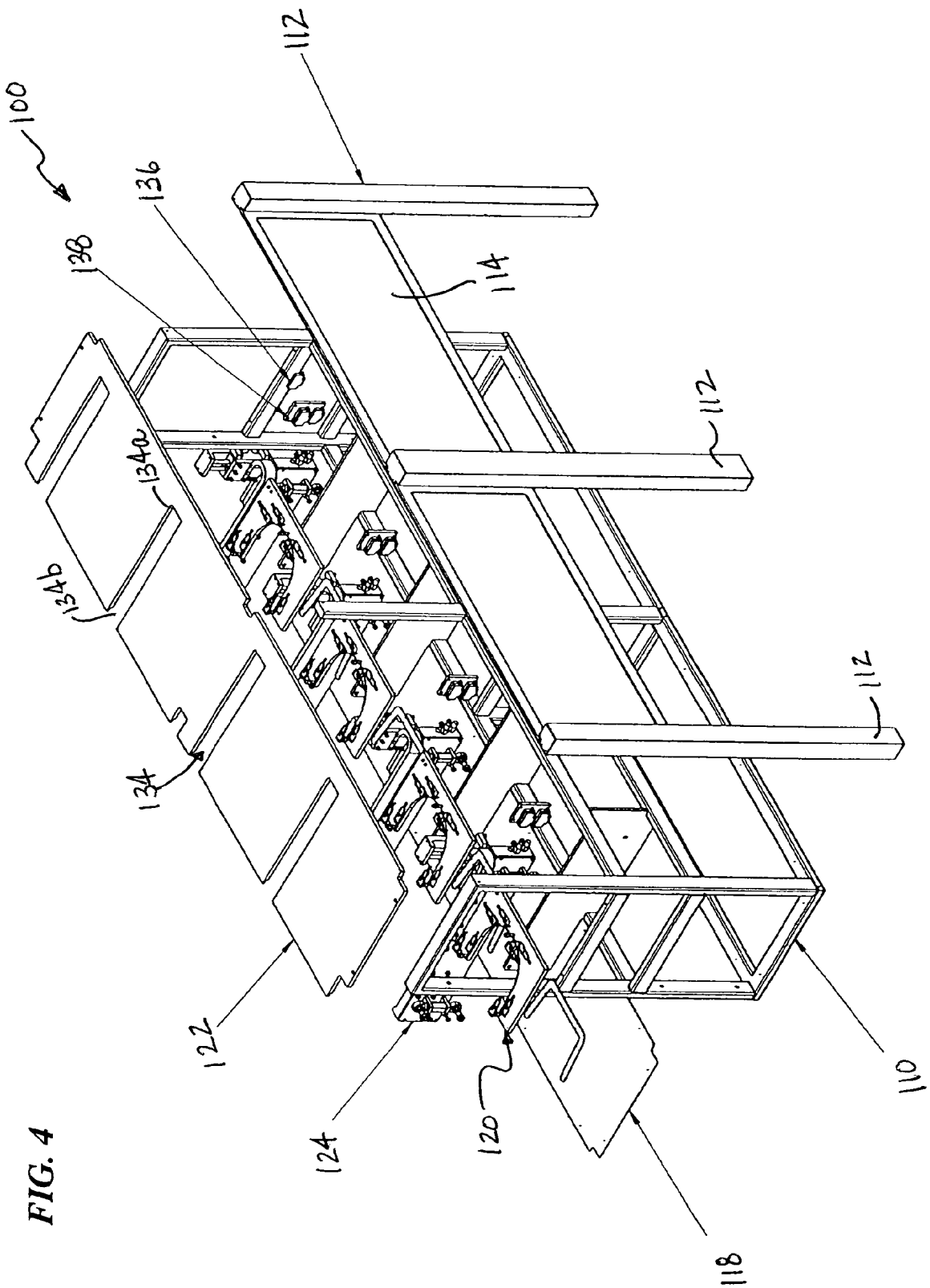
FIG. 4 is an exploded view of the load port of FIG. 3.

As shown in FIGS. 3-4, the frame assembly 110 includes vertical and horizontal frame members 112 and a base 118 positioned in a lower region of the frame assembly 110. Although not shown in FIGS. 1 and 2, the input door 114 faces away from cleaner apparatus 10 and an internal portion 110a of the frame assembly 110 is positioned adjacent the apparatus 10. The loader assembly 116 includes a fixture 120 that receives the container 12, a support plate 122, and a slider mechanism 124 that provides for movement of the fixture 120 between the door 114 and the carrier assembly 200. The fixture 120 has a receptacle 126 configured to receive the container 12, preferably the lower portion of the container 12, and at least one securing element 128 to releasably secure the container 12 within the receptacle 126. The slider mechanism 124 includes a guide rail 130 and a bracket 132 connected to the fixture 120, wherein the fixture 120 and the container 12 slidably move fore and aft along the guide rail 130. The support plate 122 includes a slot 134 dimensioned to accommodate the bracket 132 as it moves along the guide rail 130.

The guide rail 130 extends beyond a perimeter of the frame assembly 110 thereby allowing the fixture 120 to move into the cleaner apparatus 10 to either deliver a container 12 to the carrier assembly 200, or receive a container 12 from the carrier assembly 200. Accordingly, the carrier assembly 200 has sufficient clearance to receive the extending portion of the guide rail 130. In this manner, the fixture 120 is movable between an initial position (see FIG. 3), wherein the bracket 132 and the fixture 120 are positioned near the closed or interior end 134a of the slot 134 to receive the container 12, and a forwardly deployed position, wherein the bracket 132 and the fixture 120 are positioned near the open or exterior end 134b of the slot to transfer the container 12 to the carrier assembly 200. The load port 100 also includes a sensor 136 and a signal 138 to monitor the position of the fixture 120 and/or control the operation of the port 100, including the fixture 120. While FIGS. 3-4 show four distinct loaders 120 and slider mechanisms 124, the load port 100 can be configured with a greater or lesser number of loaders 120 and mechanisms 124. In one preferred embodiment, there are two loaders 120 and slider mechanisms 124 for each process chamber 400.

According to another aspect of the invention and referring to FIGS. 1, 2 and 5-10, the carrier assembly 200 is positioned within the enclosure 20 and is adapted to receive containers 12 from the load port 100 for further processing in the chambers 400, and return processed containers 12 from the chambers 400 to the load port 100. In this manner, the carrier assembly 200 serves as a transfer point for both processed and unprocessed containers 12. The carrier assembly 200 includes a deck assembly 210 that operably supports at least one carrier 212. The carrier 212 secures a container 12 for subsequent handling by the robot 300 and processing within the process chamber 400.

Figure 5:
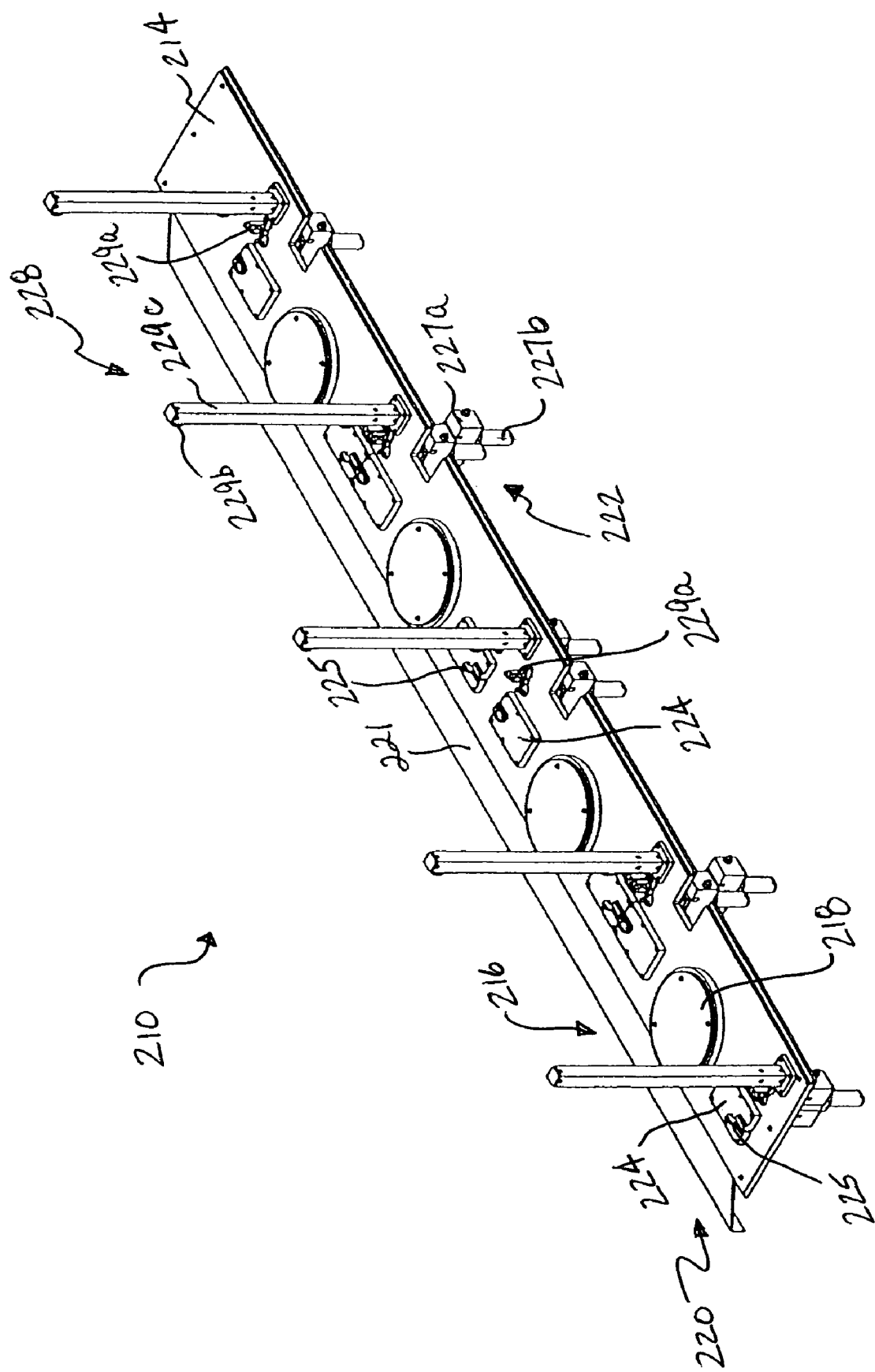
FIG. 5 is a perspective view of a carrier assembly of the cleaner apparatus.
Figure 6:
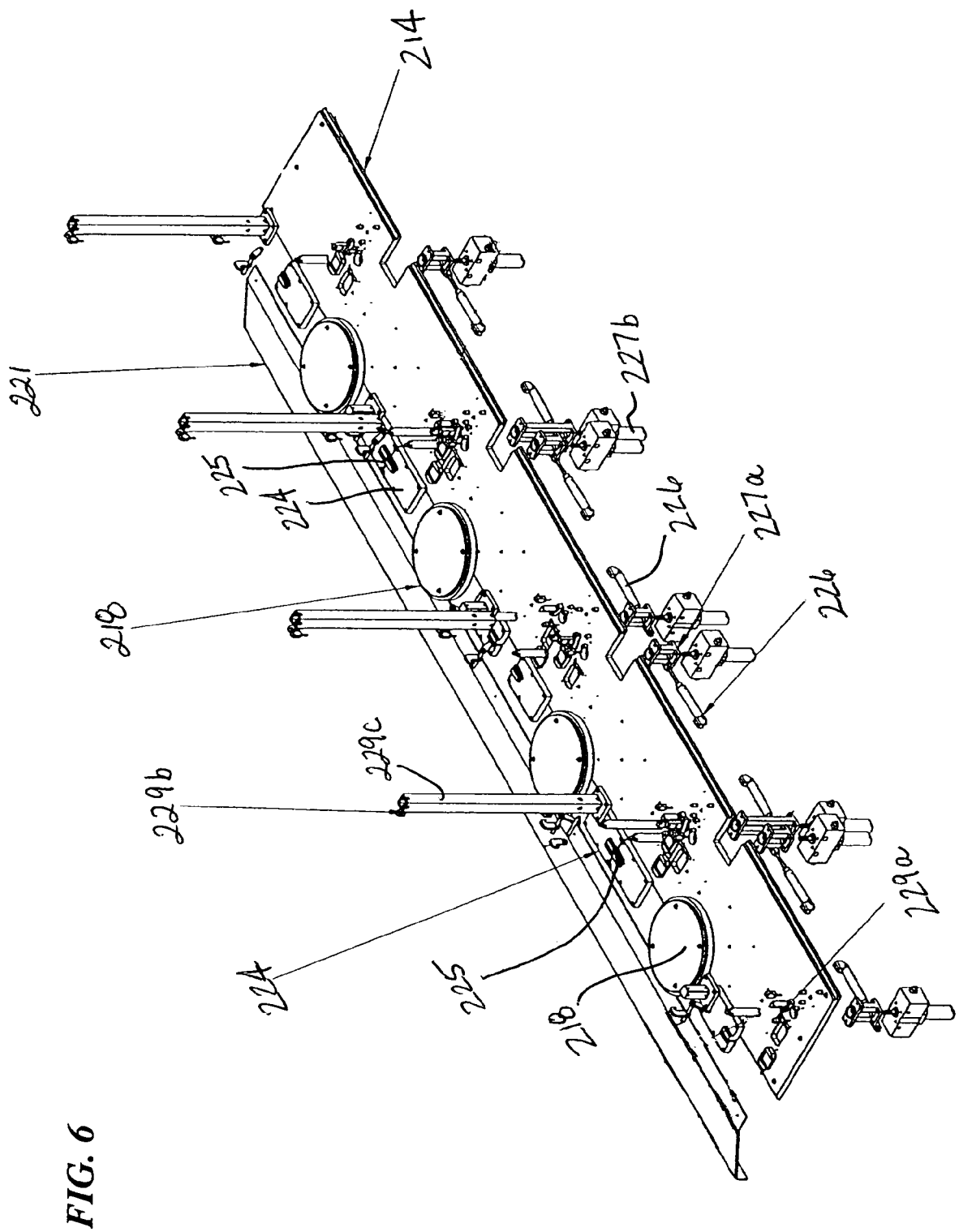
FIG. 6 is an exploded view of the carrier assembly of FIG. 5.

As shown in FIG. 5, the deck assembly 210 includes an elongated deck member 214 with at least one carrier station 216. Each station 216 represents the region of the deck assembly 210 where the carrier 212 and the container 12 interact with the deck member 214. Since the carrier 212 and the container 12 are inserted into and removed from the process chamber 400, the carrier station 216 is a transfer point for further processing once the container door 12b is removed from the container body 12a. Each station 216 includes a plate 218, a securing apparatus 220 that releasably secures a carrier 212 to the plate 218, and an actuator system 222 operably connected to the securing apparatus 220. The plate 218 is cooperatively dimensioned with an aperture 237 in the bottom frame member 236 of the carrier 212 (see FIG. 7). The aperture 237 receives the plate 218 when the carrier 212 is in a carrier docked position CDP. The carrier securing apparatus 220 includes at least one block 224 that engages a cooperatively dimensioned slot 239 in the bottom carrier frame member 236. The securing apparatus 220 further includes a latch 225 that releasably secures the carrier 212 in the carrier docked position CDP. The latch 225 is operably connected to the actuator system 222. In the carrier docked position CDP, the container 12 can be loaded into the carrier 212 for further processing in the process chamber 400, or the container can be removed from the carrier 212 after being returned from the process chamber 400. Referring to FIG. 6, the actuator system 222 can include a cylinder 226 operably connected to the latch 225 to releasably secure the carrier 212. The cylinder 226 is in fluid communication with a fitting 227a and a supply line 227b. The actuator system 222 can be pneumatic or hydraulic powered and may include a control valve and/or regulator (not shown) to meter the fluid flow to the cylinder 226. To prevent moisture from dripping onto the deck assembly 210, including the stations 216, from the process chamber 400, a drip rail 221 extends substantially the length of the deck member 214. In another embodiment, the deck 214 is enlarged to increase the number of carrier stations 216 beyond the number of receptacles 442 of the process chamber 400 such that dirty containers 12 are readied for cleaning while dirty containers 12 are being processed within the chamber 400.

The station 216 further includes a sensor assembly 228 that senses and reports the position of the carrier 212 and/or the container 12 within the station 216 to the internal controller 36. The sensor assembly 228 can also sense the location of the container door 12b relative to the carrier 212. In one embodiment, the sensor assembly 228 comprises a first sensor 229a positioned proximate the deck member 214 and a second sensor 229b affixed to a vertical support 229c extending from the deck member 214. In another embodiment, one or both of the sensors 229a, b are not mounted to the deck member 214; instead, they are positioned within close proximity such that the sensors 229a, b remain capable of reporting the position of the carrier 212 and/or container 12 relative to the station 216. For example, sensors 229a, b are affixed to a portion of the enclosure door 26 or another component of the enclosure 20. Sensors 229a, b can be an optical sensor, a fiber sensor or an ultrasonic sensor. Although FIGS. 5 and 6 show a sensor assembly 228 operably related to a single station 216, the sensor assembly 228 can include a sufficient number of sensors to monitor activity at multiple stations 216. For example, a vertical support 229c can be mounted between two stations 216 and have a sensor 229a to monitor the adjacent station 216, for example a three-beam sensor.

Referring to FIGS. 7-10, the carrier 212 is configured to receive a container 12, wherein both the carrier 212 and the container 12 undergo cleaning and drying within the process chamber 400. As shown in FIG. 7A, the carrier 212 includes a frame arrangement 230 formed from a plurality of frame members 232. The frame arrangement 230 has an internal receiver 234 that removably secures the container body 12a. The frame arrangement 230 includes a bottom frame member 236 that engages and supports a bottom portion of the container body 12a. The bottom frame member 236 includes a central aperture 237 and at least one slot 239 positioned about the aperture 237. The bottom frame member 236, including the aperture 237 and the slot 239, are configured for removable securement of the carrier 212 to the plate 218. The container 12 can be either loaded into or removed from the carrier 212 depending upon the process step. In one embodiment, the frame member 236 includes a circumferential groove 236a (see FIG. 8b) about the aperture 237 that facilitates engagement with the plate 218 in the carrier docked position CDP. The lower frame member 236 includes at least one vertically extending pin 238 that is received by a receptacle 12c in the container body 12a. The carrier 212 further includes opposed vertical members 240 that extend upward from the bottom member 236 and connect to a top member 242 to complete the frame arrangement 230. The top frame member 242 has at least one bracket 243 that is configured to engage a periphery of the container door 12b.

Figure 8A:
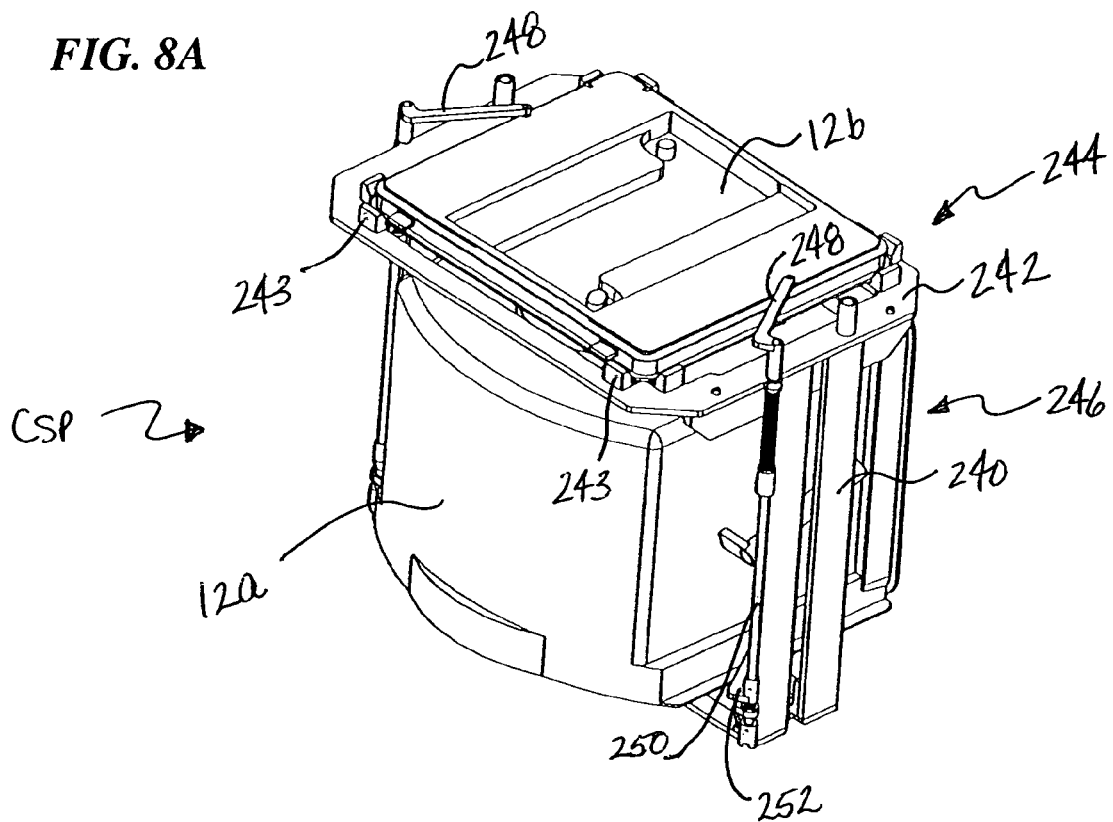
FIG. 8A is a perspective view of the carrier and a container with the container in a secured position.
Figure 8B:
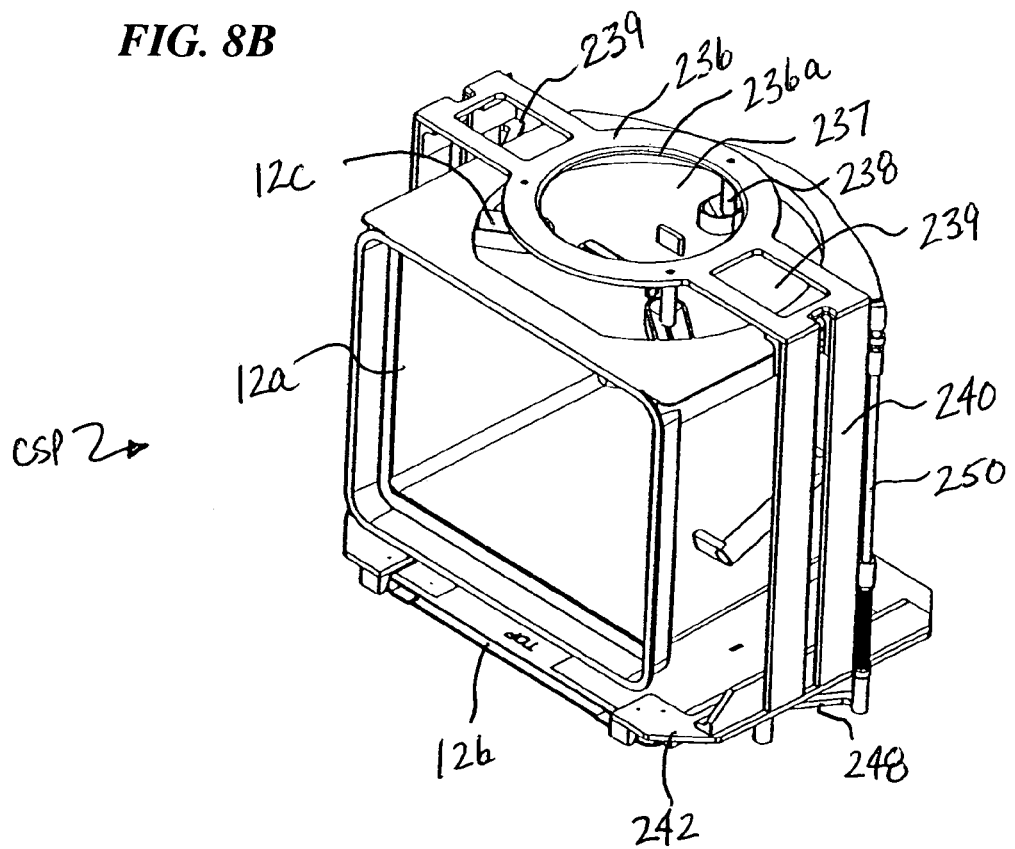
FIG. 8B is a perspective view of the carrier and the container with the container in a secured position, showing an underside of the carrier.
Figure 9:
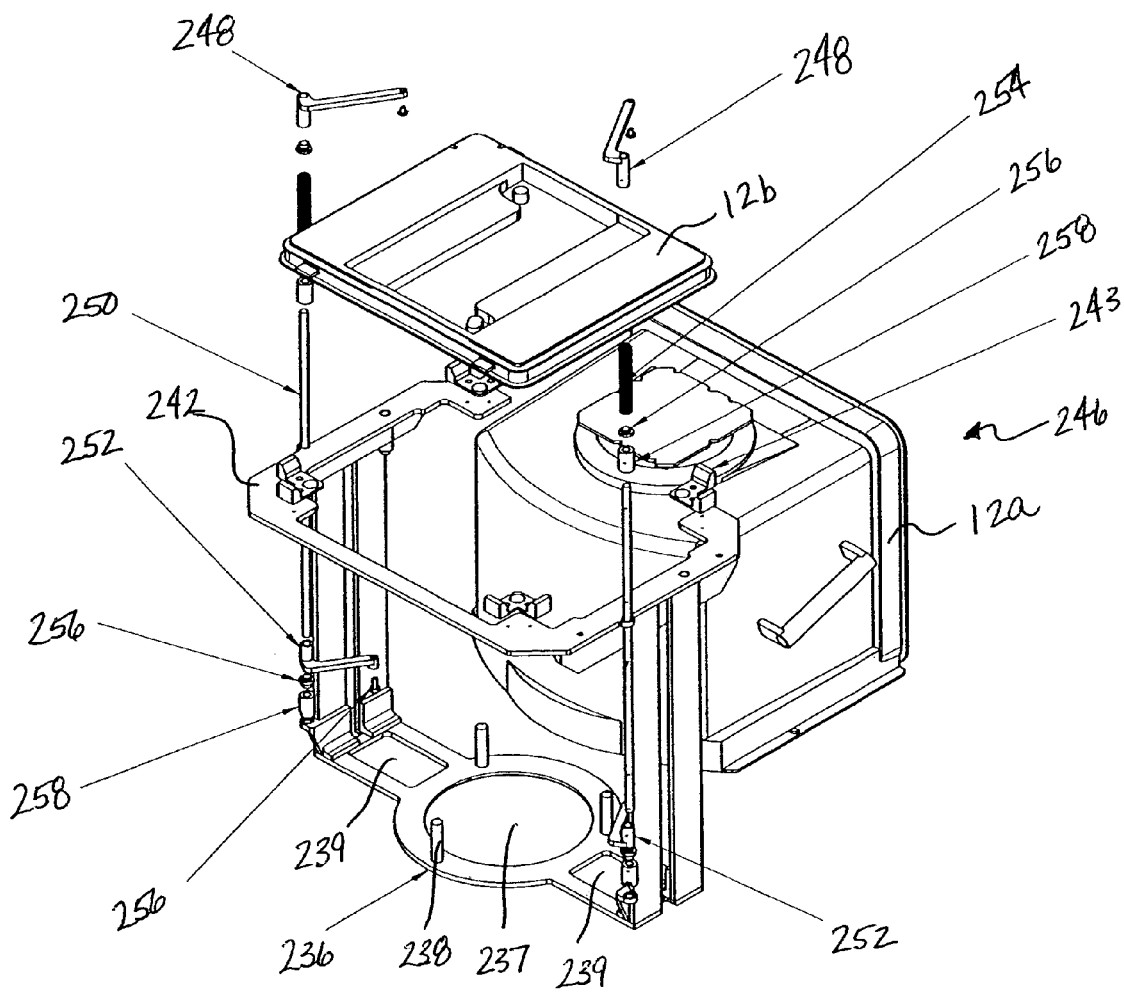
FIG. 9 is an exploded view of the carrier and the container.
Figure 10:
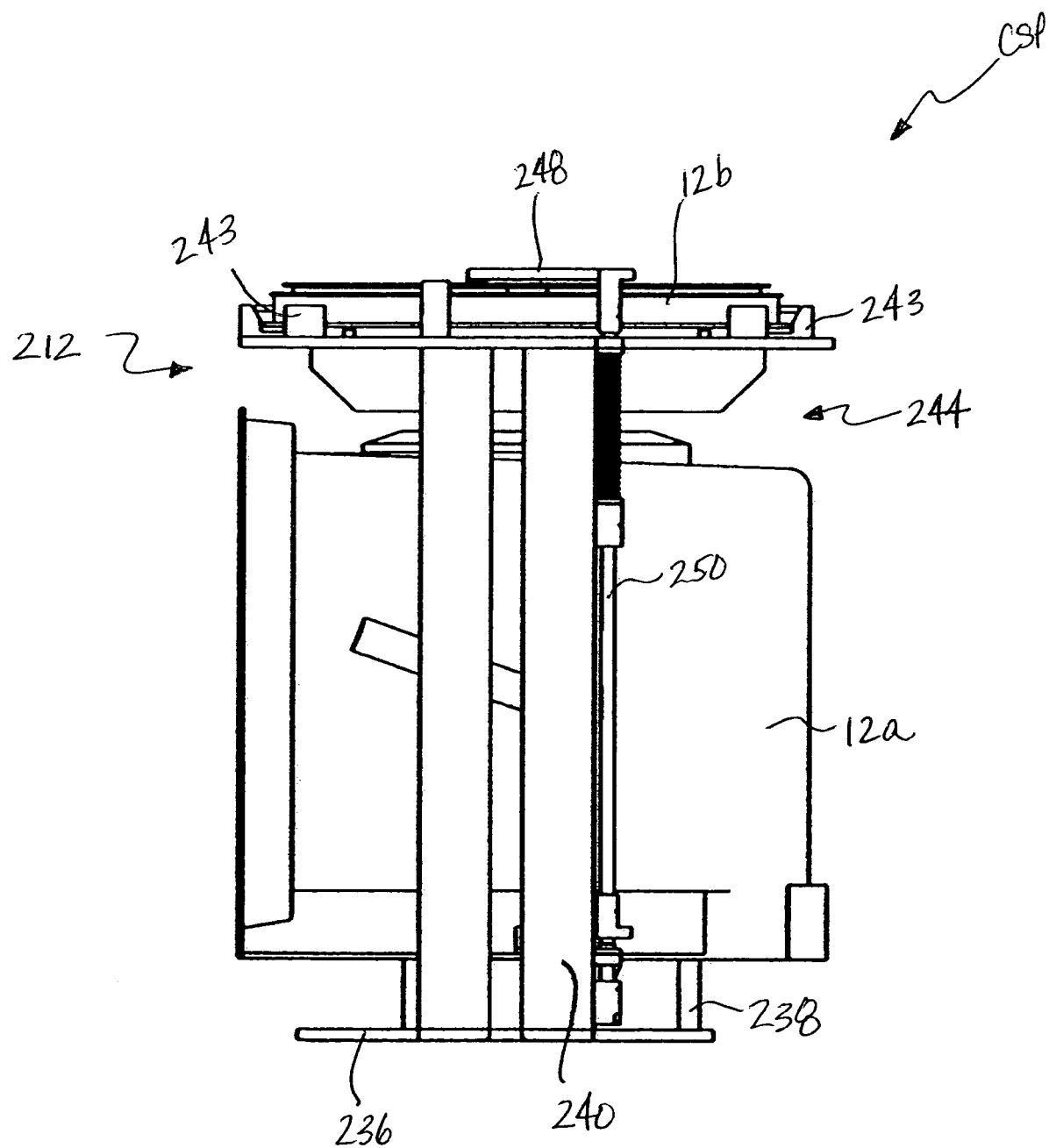
FIG. 10 is a side view of the carrier and the container with the container in a secured position.

In a container secured position CSP shown in FIGS. 8-10, a body portion 12a of the container 12 is secured within the receiver 234 of the carrier 212 and the container door 12b is secured to the top member 242 of the carrier 212. The carrier 212 includes means 244 for releasably securing the container body 12a within the receiver 234 and the container door 12b to the frame member 242. As explained below, the robot 300 removes the door 12b from the container 12 and places it into engagement with the top frame member 242. The releasable securing means 244 comprises a latch mechanism 246 that engages the container body 12a and the container door 12b.

Although a latch mechanism 246 for each side of the container 12 is shown in FIGS. 8-10, a single mechanism 246 can be employed to secure the container 12. The latch mechanism 246 includes an upper latch 248 that pivots about a vertical shaft 250, and a lower latch 252 operably connected to the shaft 250. Since the latches 248, 252 are spring loaded, the mechanism 246 includes a variety of smaller components, including coil springs 254, bushings 256, and spring sleeves 258. In the container secured position CSP (see FIGS. 8A and 8B), the upper latch 248 engages an inner surface of the container door 12b and the lower latch 252 engages a lower extent of the container body 12a. In an unsecured position, the upper latch 248 rests against a stop 255 extending from the top frame member 242 and the lower latch 252 rests against a stop 257 adjacent the vertical frame member 240. Instead of the pivotable latches 248, 252, the securing means 244 can include a collection of projections that engage receivers on the container body 12 and door 12b, or an arrangement of rails that the container body 12 and door 12b slide along for securement to the carrier 212.

Figure 7A:
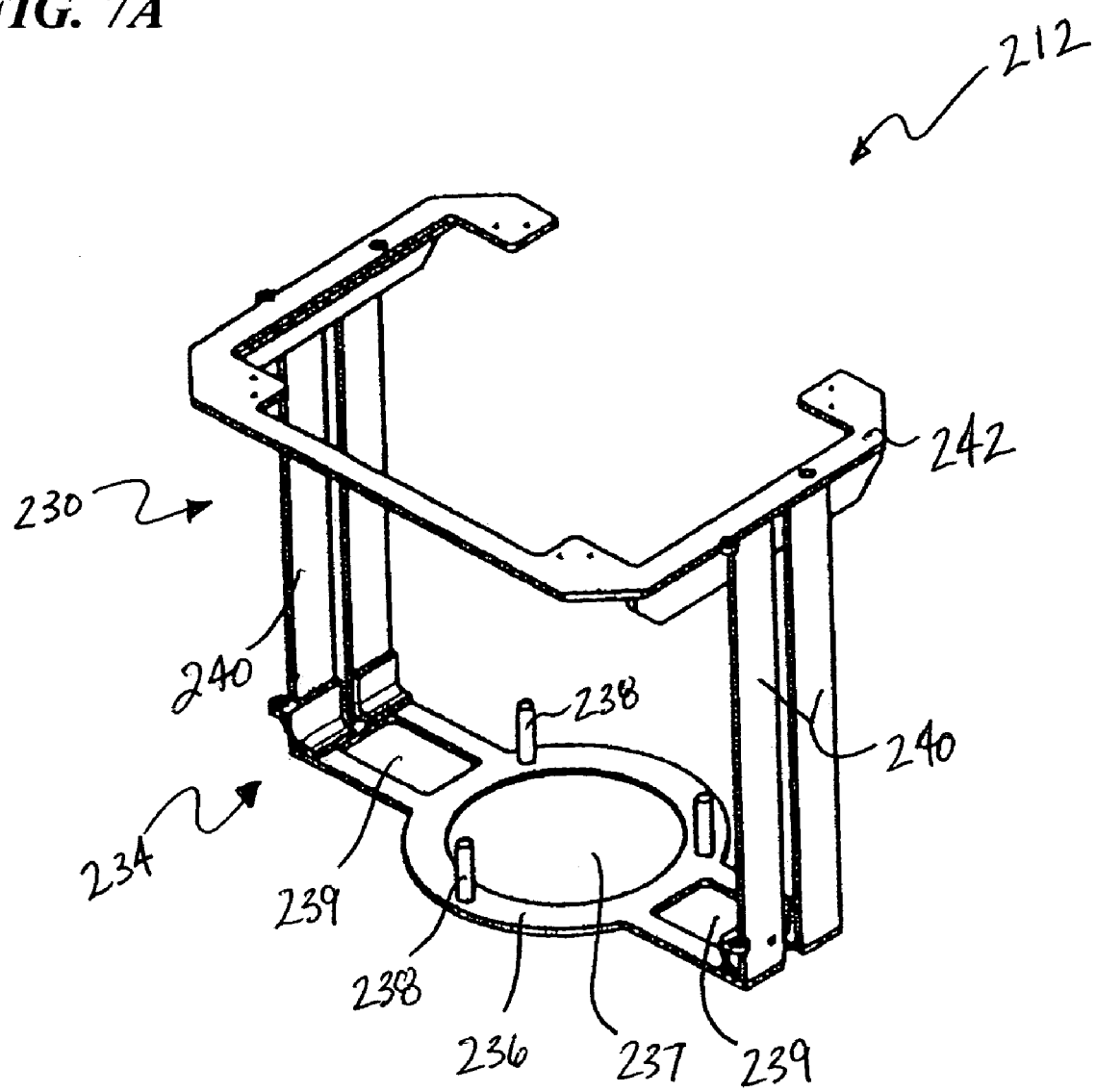
FIG. 7A is a perspective view of a carrier of the assembly of FIG. 6.
Figure 7B:
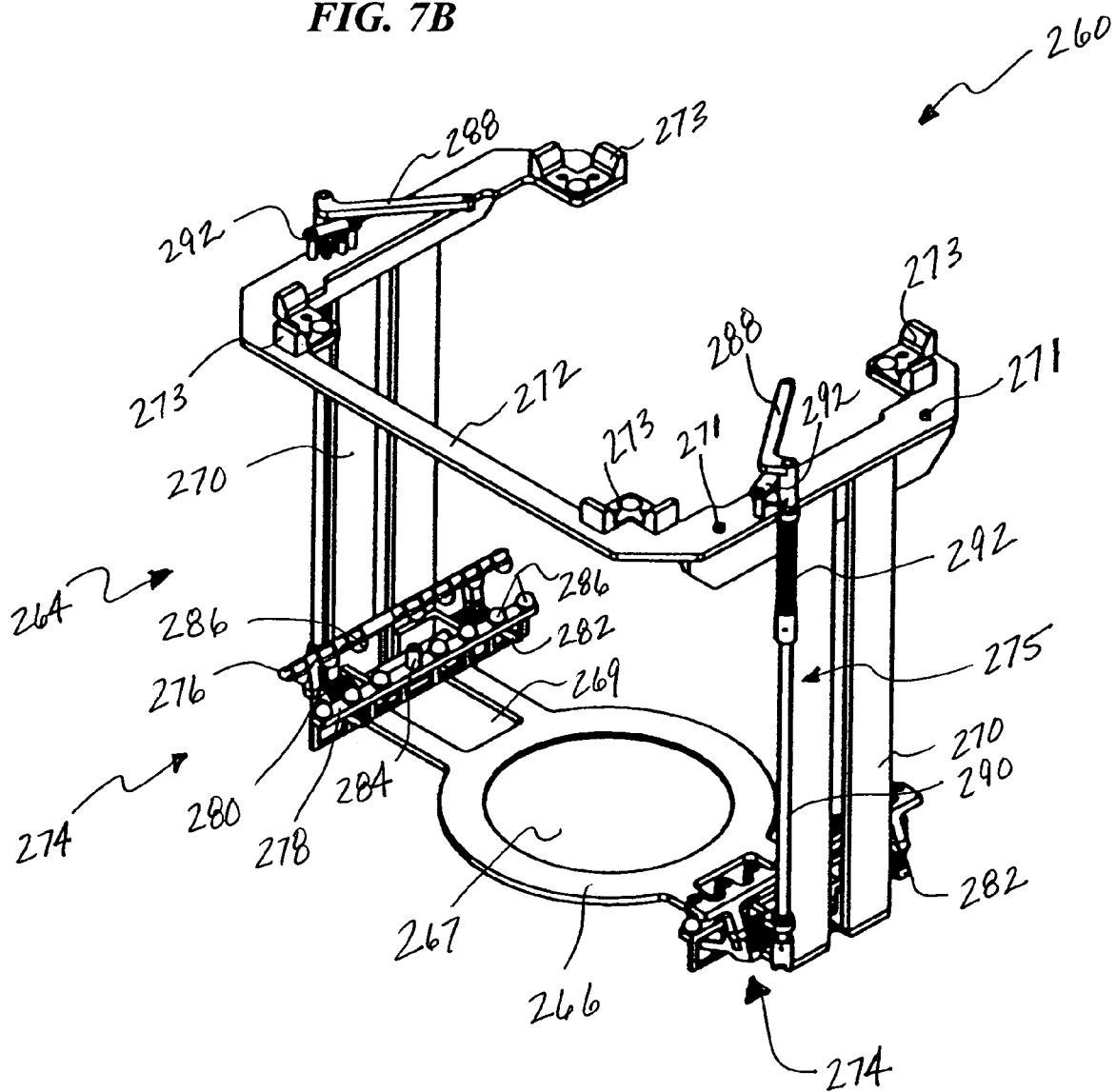
FIG. 7B is a perspective view of an alternate carrier of the assembly of FIG. 6.
Figure 7C:
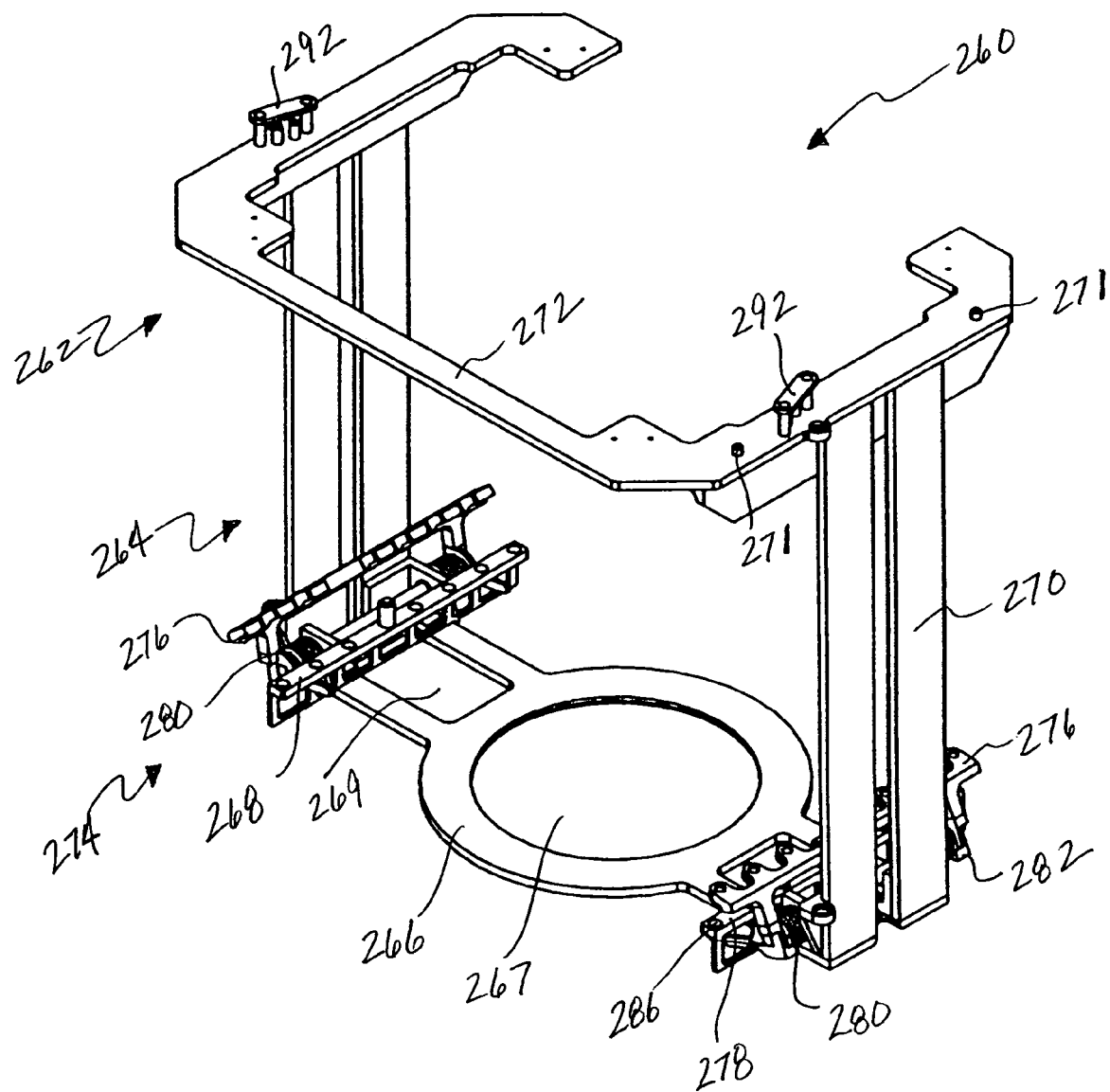
FIG. 7C is a perspective view of the alternate carrier of FIG. 7B.

An alternate carrier 260 is shown in FIGS. 7B and C. Like the carrier 212 of FIG. 7A, the carrier 260 includes a frame arrangement 262 formed from a plurality of frame members that defines an internal receiver 264 that removably secures the container body 12a. The frame arrangement 262 includes a bottom frame member 266 with a central aperture 267 and at least one slot 269 positioned about the aperture 267. The bottom frame member 266, including the aperture 267 and the slot 269, are configured for removable securement of the carrier 212 to the plate 218. The frame arrangement 262 further includes opposed vertical members 270 that extend upward from the bottom member 266 and connect to a top member 272. The top frame member 272 has at least one bracket 273 (see FIG. 7B) that is configured to engage a periphery of the container door 12b. The top frame member 272 also has at least one pin 271 extending upward and as explained below, configured to engage a portion of the robot 300. Preferably, the pin 271 is positioned external to a perimeter defined by the brackets 273.

The carrier 260 further includes a clamp mechanism 274 that engages a portion of the container body 12a and a latch mechanism 275 that engages the container door 12b. The clamp assembly 274 includes an upper rail member 276, a lower rail member 278, a spring 280 and a control arm 282. The clamp mechanism 274 is moveable between an open position (see the left assembly 274 in FIGS. 7B and C) wherein an extent of the container body 12a can be received, and a closed position (see the right assembly 274 in FIGS. 7B and C) wherein the container body 12a is secured by the clamp mechanism 274. The lower rail 278 includes at least one vertically extending pin 284 that is received by a portion of the container body 12a. Each rail 276, 278 includes a plurality of raised tabs or bumps 286 that define an engaging surface for the container body 12a. Preferably, the tabs 286 have a domed configuration and are formed from a polymer material. The clamp mechanism 274 operates independently of the latch mechanism 275 and is actuated between the open and closed positions by a carrier assembly air cylinder (not shown) that engages the control arm 282. The latch mechanism 275 includes an upper latch 288 that pivots about a vertical shaft 290 and a spring 292. In the container secured position CSP the upper latch 288 engages an inner surface of the container door 12b. The movement of the latch 288 is constrained by the restrictor element 292 that is connected to the upper frame member 272. Prior to the removal of the door 12b, the clamp mechanism 274 is actuated to secure the container body 12a. As explained below, once the robot 300 removes the door 12b and positions it on the upper frame member 272, the latch mechanism 275 is activated to secure the door 12b. After the container 12 is processed within the process chamber 400, the latch mechanism 275 is released to enable the robot 300 to engage the door 12b and reassemble the container 12. The clamp mechanism 274 is then released to permit the load port fixture 120 to access and remove the assembled container 12 from the carrier 260.

According to another aspect of the invention, the robot 300 of FIGS. 11-16 inserts and removes the container 12 and the carrier 212 into the process chamber 400. Prior to insertion in the process chamber 400, the robot 300 unlocks the door 12b from the container body 12a, and reassembles the container 12 upon removal from the process chamber 400. The robot 300 is configured to move along the length of the carrier assembly 200 in a controlled manner, wherein the robot 300 stops at a selected carrier station 216 to engage a carrier 212 and container 12 for placement into the process chamber 400. The robot 300 is further configured to move proximate the process chamber 400 to return a carrier 212 and container 12 to a station 216. The robot 300 can then engage the door 12b and return it to the container 12 wherein the entire container 12 is transferred from the carrier deck 210 to the load port 100. The robot 300 generally includes a vertical support 302 and an actuator arm 304 operably coupled to the vertical support 302. The actuator arm 304 includes two distinct end effectors—a first end effector 306 and a second end effector 308—configured for engagement with the container 12 and the carrier 212, respectively. As explained in greater detail below, the first end effector 306 removes the container door 12b from the container body 12a before both are inserted into the process chamber 400, and the second end effector 308 engages the carrier 212 to permit movement of the carrier 212 and the container 12 between the carrier assembly 200 and the process chamber 400. The first end effector 306 engages the door 12b and returns it to the container 12 for further handling by the load port 100.

Figure 11:
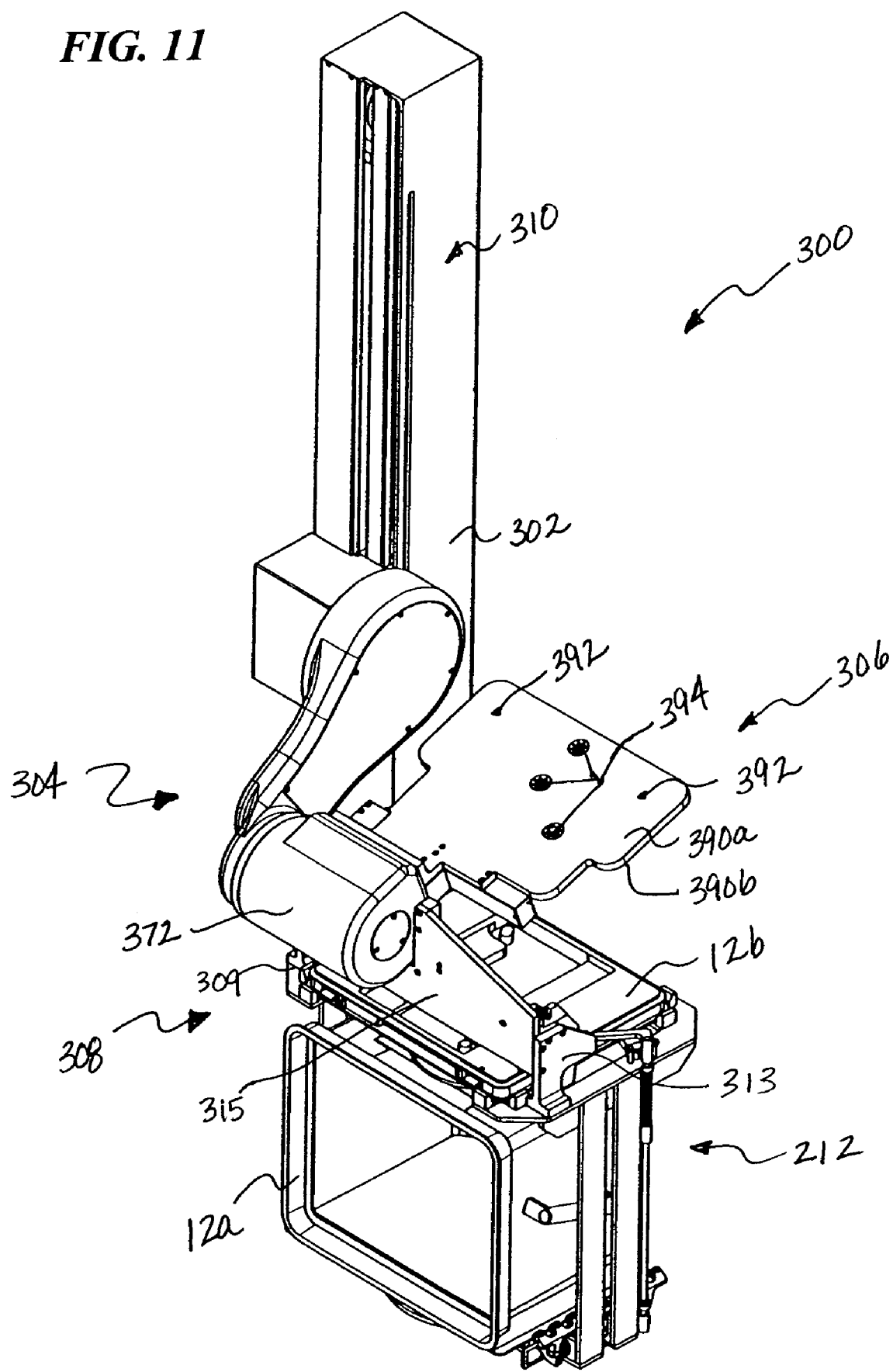
FIG. 11 is a perspective view of a robot assembly of the cleaner apparatus, showing the robot assembly engaging the container and the carrier.
Figure 12:
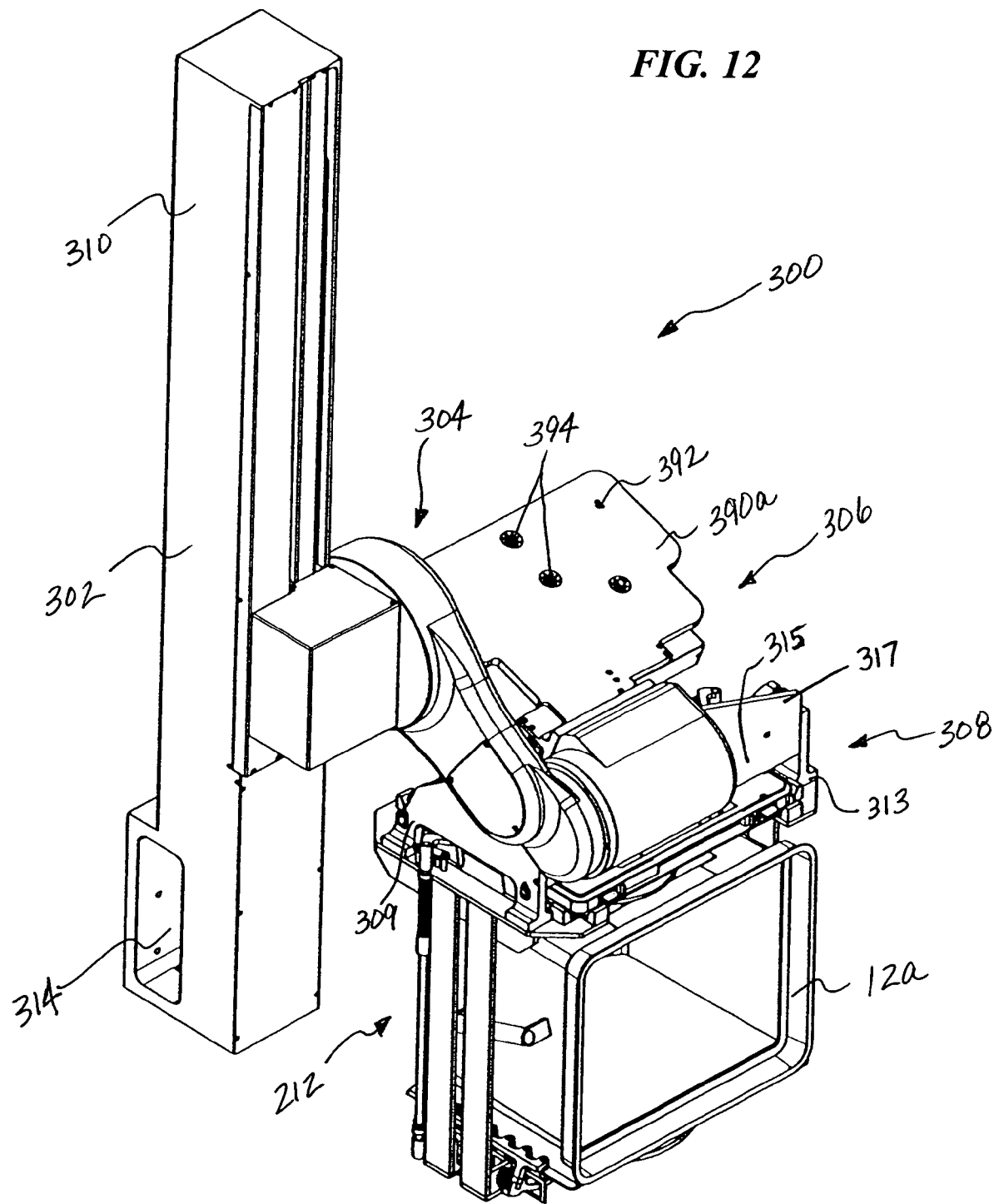
FIG. 12 is a perspective view of the robot assembly, showing the robot assembly engaging the container and the carrier.
Figure 13:
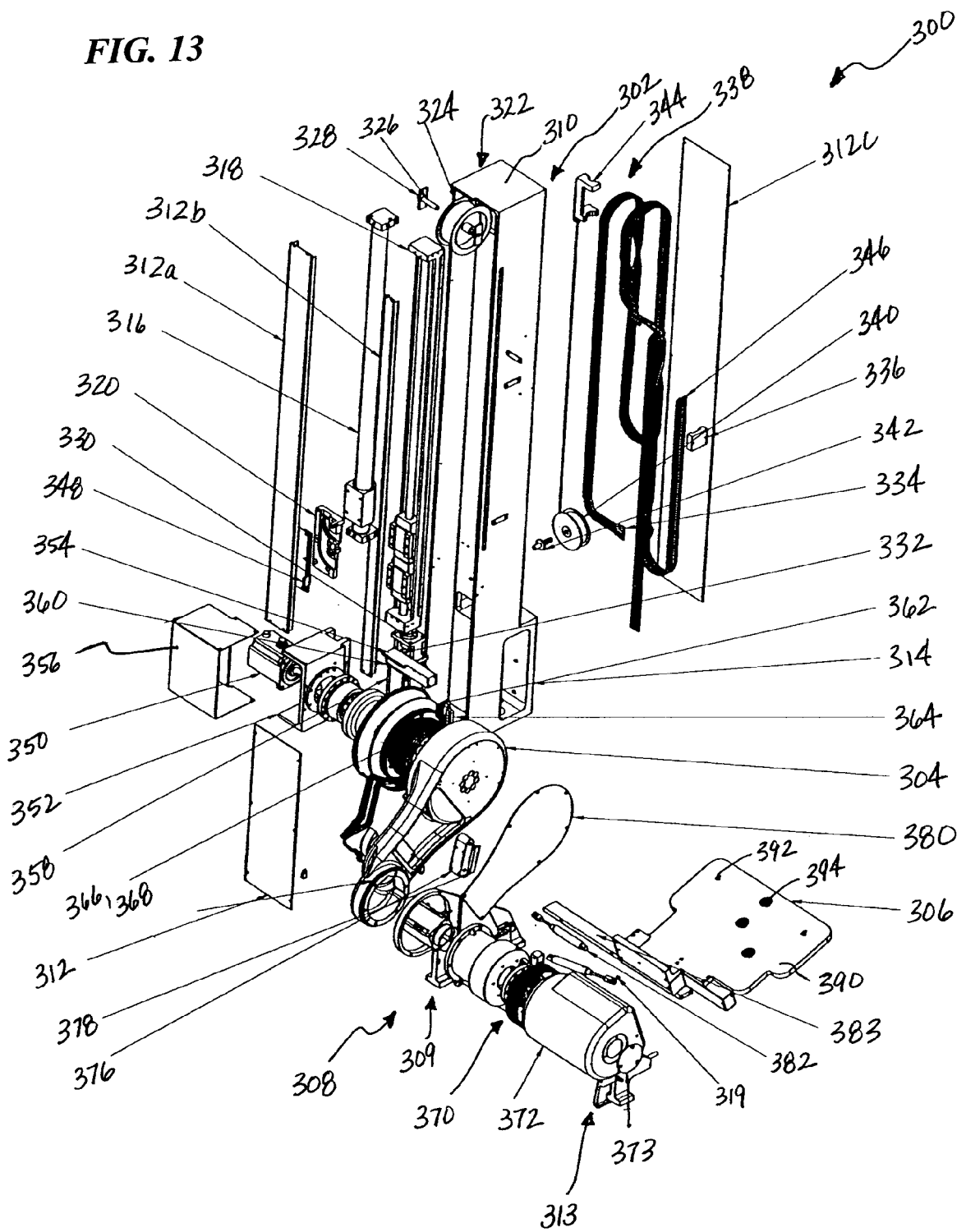
FIG. 13 is an exploded view of the robot assembly.

As shown in FIGS. 11-13, the vertical support 302 includes a housing 310 formed from an arrangement of removable side panels 312, wherein a number of internal operational components are positioned within the housing 310. An aperture 314 is located at the base of the support 302 and is dimensioned to receive a substantially horizontal beam (not shown) that provides for movement of the robot 300 along the carrier assembly 200. The robot 300 further includes a magnetic cylinder 316 positioned within the housing 310 wherein the cylinder 316 uses a magnetic field to provide a counterbalance for the loads experienced by the robot 300, primarily the actuator arm 304, during operation. The magnetic cylinder 316 is operably connected within the housing 310 by bracket 320 and behind a first front panel 312a. A monocarrier 318 is operably connected to the actuator arm 304 to precisely control its vertical movement and position with respect to the carrier 212 and/or the container 12. The carrier 318 is located adjacent the magnetic cylinder 316 within the housing 310 behind a second front panel 312b. The magnetic cylinder 316 and the carrier 318 are positioned below a front pulley assembly 322 including a spool 324, shaft 326 and bracket 328. A bellow 330 is positioned between the carrier 318 and a carrier driver 332.

For engaging the container door 12b, the robot 300 has an internal vacuum system 333 that provides a partial vacuum or suction through lines extending through the vertical support 302 and the actuator arm 304 to the first end effector 306. Unlike existing vacuum devices which include external components, the system 333 includes internally routed delivery lines that supply a working fluid, such as compressed air, through the actuator arm 304 to the first end effector 306. A first flexible line 334 is enclosed within the housing 310 and routed through the vertical support 304. A bracket 336 and a pulley assembly 338, including spool 340, shaft 342 and bracket 344, support the flexible line 334 during operation of the robot 300. Electrical lines 346 are also positioned within the housing 310 to supply power to the robot 300. A lower portion of the first front panel 312a includes a coupling 348 that secures the flexible line 334.

The actuator arm 304 includes a driver 350 connected to a U-shaped mount plate 352 and a bracket 354 wherein the driver 350 provides for rotation of the actuator arm 304 about an axis defined by the driver shaft. A driver panel 356 and the mount plate 352 enclose the driver 350. The mount plate 352 has a pair of teeth 360 that mate with an extent of the carrier 318 wherein the coupling provides for vertical movement of the actuator arm 304 along the support 302. The actuator arm 304 also includes a collar 362 with a bulkhead 364 that internally houses a second flexible line 366 and electrical lines 368. The second flexible line 366 extends through the actual arm 304 and is in fluid communication with the first end effector 306 and the first flexible line 334 of the vertical support 304 to form the internal vacuum system 333. The electrical lines 368 deliver power to a driver 370 located within a housing 372 for the first end effector 306. The housing 372 includes a removable end cover 373. The actuator arm 304 further includes a rear cover 374, a strain relief 376 and retainer 378 for the second flexible line 366 and the electrical line 368, and a front cover 380. The housing 372 provides a mounting point for the first end effector 306 and includes a cylinder 382 and bracket 384 positioned between the housing 372 and the first end effector 306. As explained below, the cylinder 382 is linked to internal structure of the first end effector 306 to actuate the keys 392 used to unlock the container door 12b. To maintain the pressure gradient between the first end effector 306 and the container door 12b, the actuator arm 304 has at least one O-ring 386.

As mentioned above, the first end effector 306 is used to remove the container door 12b from the container body 12a before both are inserted into the process chamber 400. Referring to FIGS. 14A, B and 15, the first end effector 306 includes a plate 390 with at least one key or protrusion 392 extending from an outer surface of the plate 390. The key 392 is dimensioned to be received by a recess in the container door 12b to unlock the container 12 when in the container secured position CSP. The key 392 can be configured as a cylinder that extends from the plate 390 with teeth to unlock the container door 12b. The operation of the first end effector 306 is explained in detail below.

The plate 390 further includes at least one suction element 394 that is in fluid communication with the internal vacuum system 333. Once the container door 12b is unlocked, the suction element 394 engages the container door 12b to seal the interface region between the element 394 and the door 12b such that the air within the region can be withdrawn by the vacuum system 333 to create a partial vacuum. With the aid of the suction element 394, the container door 12b remains engaged with the plate 390 for elevation and/or manipulation by the first end effector 306. While the suction element 394 can be configured as a cup with a projecting male segment, or a port, the element 394 seals the interface region between the plate 390 and the container door 12b to assure the necessary pressure gradient to create the partial vacuum. The suction element 394 includes a locator 395 that facilitates proper engagement between the element 394 and the container door 12b. The locator 395 can be a locating pin or spike that extends a short distance from the suction element 394.

Figure 14:
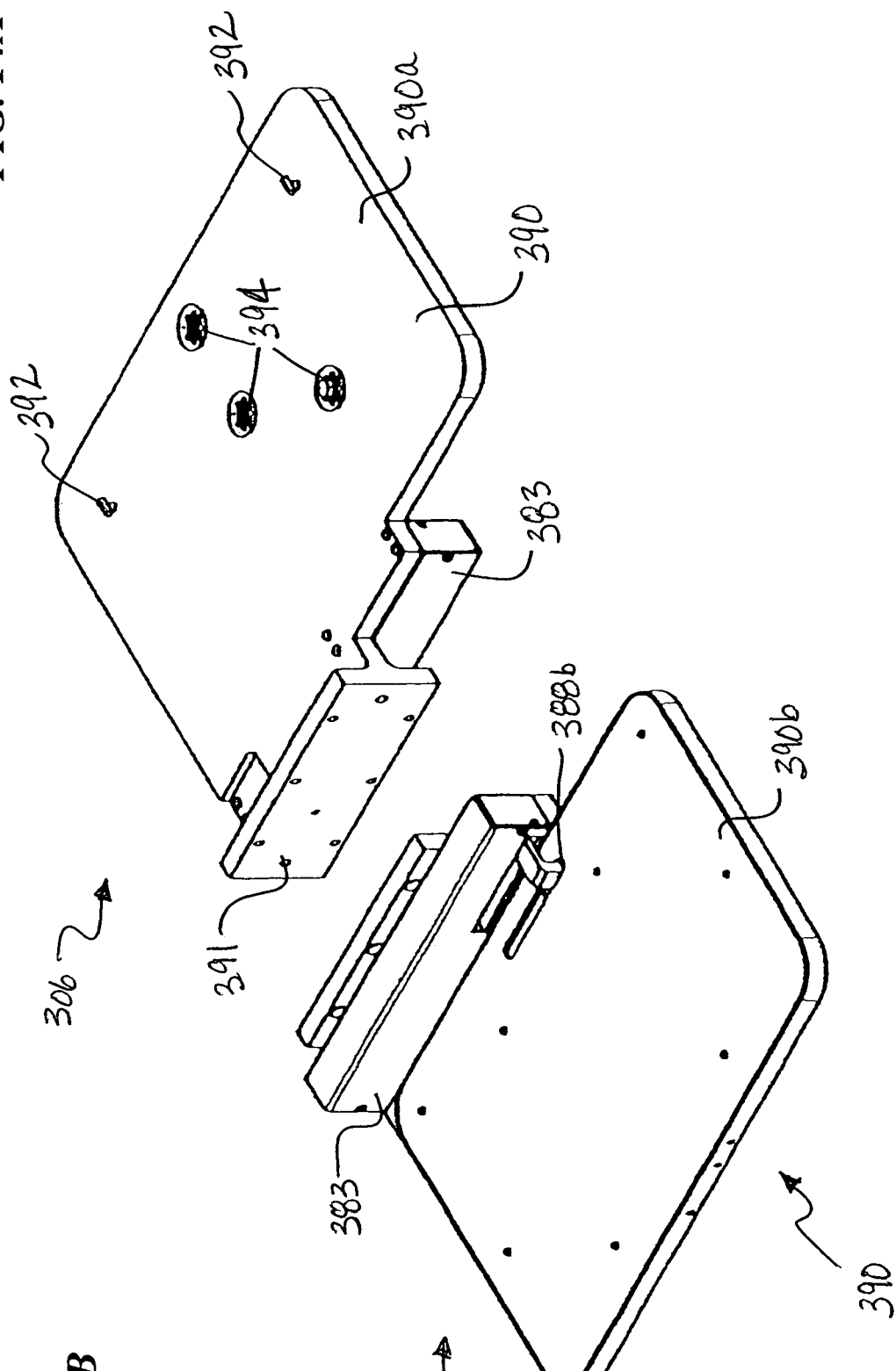
FIG. 14A is a perspective view of the first end effector of the robot assembly, showing a first side of the end effector.
FIG. 14B is a perspective view of the first end effector, showing a second side of the end effector.
Figure 15:
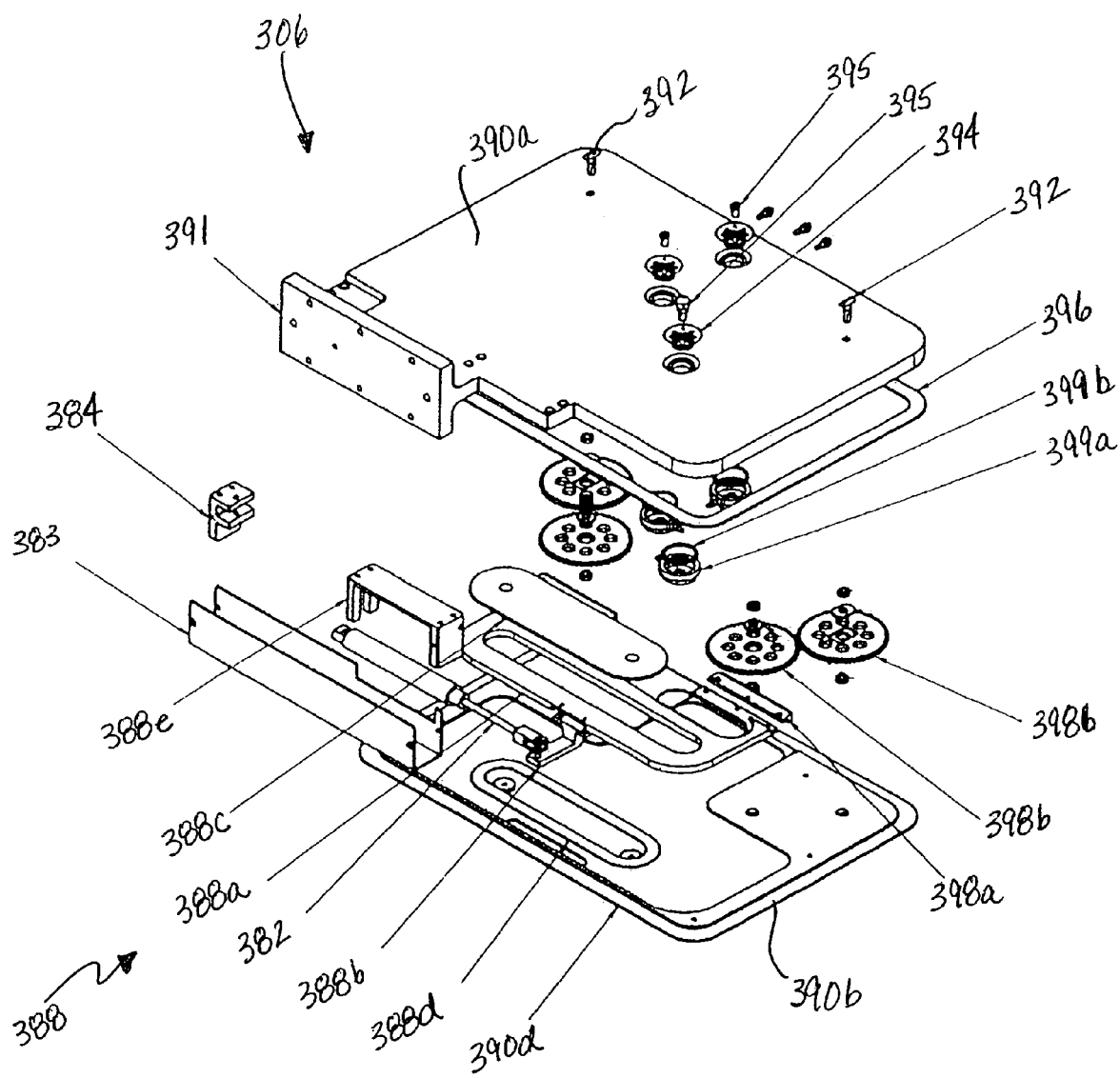
FIG. 15 is an exploded view of the first end effector of the robot assembly.
Figure 16A:
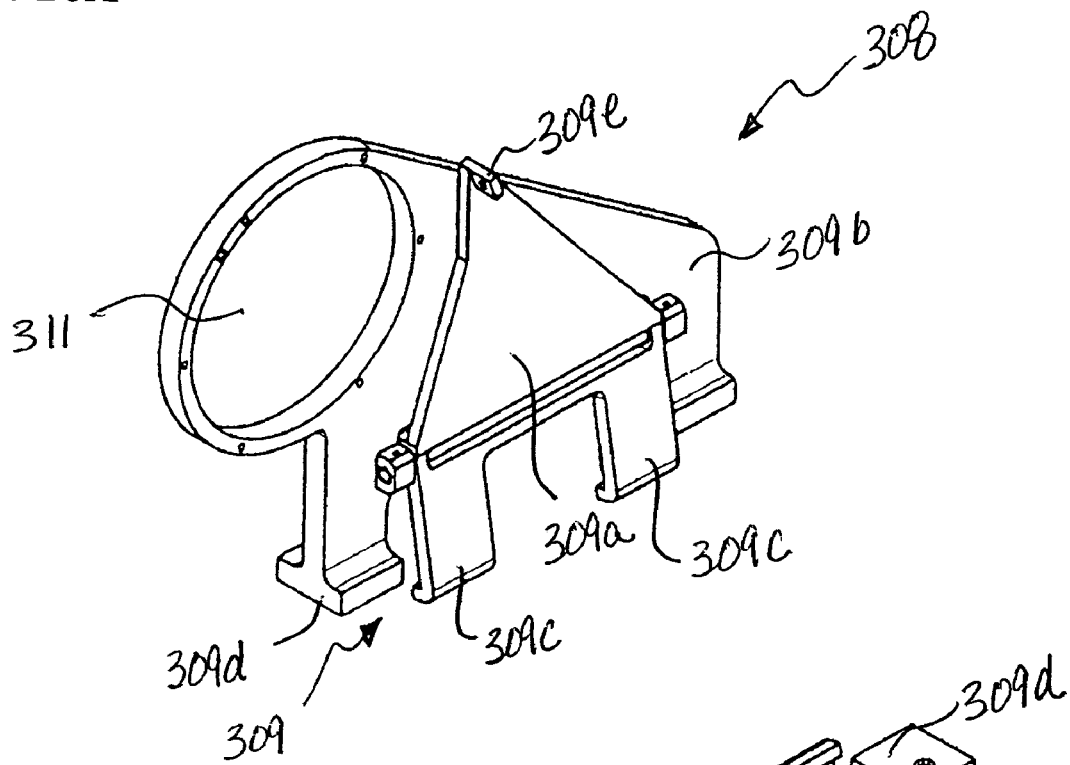
FIG. 16A is a perspective view of a portion of the second end effector of the robot assembly, showing a first clamp assembly of the end effector.
Figure 16B:
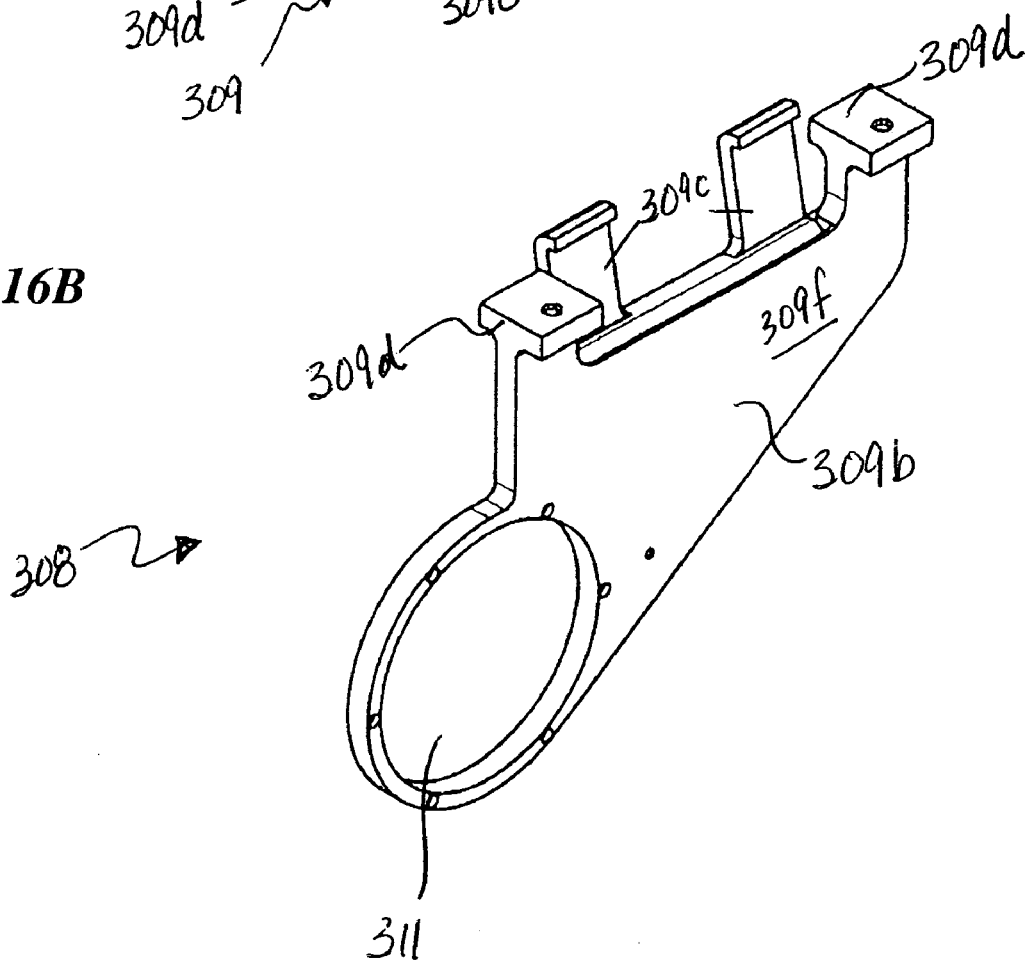
FIG. 16B is a perspective view of a portion of the second end effector, showing the first clamp assembly.
Figure 16C:
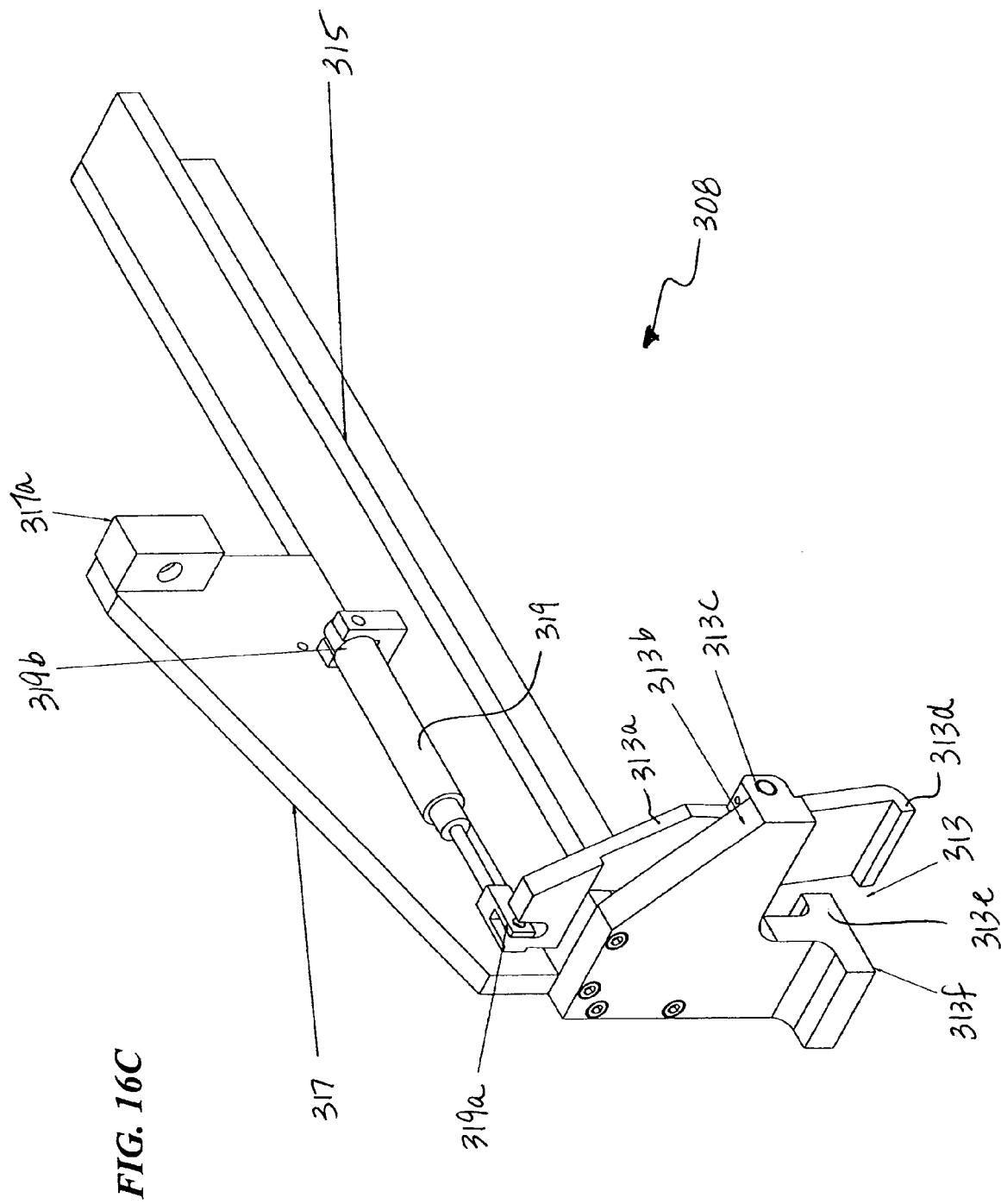
FIG. 16C is a perspective view of a portion of the second end effector, showing a second clamp assembly of the end effector.

As shown in FIGS. 14 and 15, the plate 390 has opposed outer walls 390a, b that define a plate thickness. Preferably, the plate thickness is approximately 0.5 inch to provide the first end effector 306 with a compact configuration that facilitates engagement with the container door 12b. The plate walls 390a, b further define an internal cavity that contains a number of components that enable to the first end effector 306 to engage and move the container door 12b with the above-described vacuum. Thus, the first end effector 306 includes a seal 396 that is positioned along a periphery of the plates 390a, b and an internal slider assembly 388 that provides for movement of the first end effector 306. The slider assembly 388 is linked with the cylinder 382 by a bracket 384. The cylinder 382 is housed within the cover 383 below the bottom plate wall 390b. The first plate wall 390a includes a bracket 391 that connects the first end effector 306 to the housing 372. The slider assembly 388 includes an internal slider plate 388a with bracket 388b for connection to cylinder 382, a first cover plate 388c, a second cover plate 388d, and a hard-stop bracket 388e to limit movement of the cylinder 382. The bracket 338b is received in a slot of the bottom plate wall 390b (see FIG. 14B). The first end effector 306 further includes a gear assembly 398 for actuation of the key 392 used to unlock the container door 12b. The gear assembly 398 includes a gear rack 398a operably connected to the slider 388a and a plurality of gears 398b operably connected to the key 392.

The first end effector 306 further includes an internal channel 399 that includes a suction element cap 399a and an o-ring 399b. The internal channel 399 is in communication with the suction element 394 and the second flexible line 366. Thus, the internal channel 399 is a component of the internal vacuum system 333 that links the suction element 394 with the first and second flexible lines 334, 366. A pump (not shown), for example a centrifugal pump, is in fluid communication with the first end effector 306 in order to evacuate air from the interface region and create the required pressure gradient to enable the suction element 394 to secure the container door 12b. The first end effector 306 and the element 394 represent the suction side of the pump, while the pump outlet is the discharge side of the pump. The internal vacuum system 333 can also include a sensor at the pump's suction side and/or discharge side to control the operation of the pump. For example, if the suction pressure of the pump becomes too low, the sensor signals the pump controller and the controller instructs the pump to reduce or cease operation. In another embodiment, the first end effector 306 has a pair of fingers that extend from the bracket 384, instead of the continuous plate 390. The fingers are spaced a distance to define a central opening, and each finger can have a key 392, a suction element 394 and an internal channel 399.

As briefly explained above, the second end effector 308 engages the carrier 212 to permit movement of the carrier 212 and the container 12 between the carrier assembly 200 and the process chamber 400. Alternatively, the second end effector 308 engages the container 12 while it is secured within the carrier 212 for movement between the carrier assembly 200 and the process chamber 400. While both the second end effector 308 and the first end effector 306 are components of the robot 300, the second end effector 308 is structurally and operationally distinct from the first end effector 306. Whereas the first end effector 306 unlocks, removes and rotates the container door 12b into position with the carrier's container securing means 244, the second end effector 308 releasably secures the container 12 and the carrier 212 to the robot 300 for further handling. In another embodiment, the first and second end effectors 306, 308 are combined into a single end effector with the disclosed structure that enables the single end effector to perform the above-described functions of both.

Referring to FIGS. 13 and 16A-C, the second end effector 308 includes a first clamp assembly 309 and a second clamp assembly 313, each configured to releasably engage a portion of the carrier 212 to allow the robot 300 to move the container 12 and the carrier 212 between the carrier station 216 and the process chamber 400. The first clamp 309 includes a first member 309a pivotally connected to a second member 309b. The first member 309a includes at least one finger 309c that is positioned adjacent a finger 309d of the second member 309b in the closed position of FIGS. 16A and B. When the clamp 309 is moved to an open position, there is a gap between the two fingers 309c, d which enables the second end effector 308 to receive the carrier 212 segment. The first member 309a includes a bracket 309e for connection to a driving element that actuates the clamp 309. The first member 309a further includes an aperture 311 that receives a component of the driver 370 to mount the end effector 308 to the actuator arm 304. A transverse beam member 315 extends between the first and second clamp assemblies 309, 313 wherein the second clamp assembly 313 is positioned near an outer end of the driver housing 372. Specifically, the beam 315 extends from a surface 309f (see FIG. 16B) of the second member 309b to the second clamp assembly 313. The second clamp assembly 313 includes a first member 313a pivotally connected to a second member 313b with a pin 313c. The first member 313a includes at least one finger 313d that is positioned adjacent a finger 313e of the second member 313b in the closed position of FIG. 16C. The second member 313b also includes an external finger 313f and at least one aperture (not shown) that receives the pin 274 that extends from the upper frame member 272 of the carrier 212. A support plate 317 with bracket 317a is used to affix the second clamp assembly 313 and the beam 315 to the driver housing 372. An air cylinder 319 is connected between mounting points 391a, b to join the second clamp assembly 313 and the beam 315, wherein the air cylinder 319 actuates the second clamp assembly 313.

Accordingly, the second end effector 308 represents the combination of the first clamp assembly 309, the second clamp assembly 313 and the transverse beam 315 extending there between. The second end effector 308 can be integral with a component of the actuator arm 304, for example, an end plate of the driver 370, or the second end effector 308 can be a distinct and severable component of the actuator arm 304. In one embodiment, the second end effector 308 engages opposed sides of the top frame member 242 of the carrier 212. In another embodiment, the second end effector 308 engages opposed vertical side frame members 240 of the carrier 212. In yet another embodiment, the second end effector 308 engages both the top frame member 242 and the side frame member 240 of each side of the carrier 212.

According to yet another aspect of the invention, the apparatus 10 includes the process chamber 400 which is located within the enclosure 20 and in close proximity to the robot 300 such that containers 12 and the carriers 212 can be inserted and removed by the robot 300. In general terms, the process chamber 400 includes a rotor assembly 402, a door assembly 404 for sealing the rotor assembly 402 during operation, and a chamber housing 406 to which the door assembly 404 is operably connected. As explained below the process chamber 400 also includes means for cleaning the container 12 and carrier 212, and means for drying the container 12 and carrier 212. Although FIG. 1 shows two distinct process chambers 400, the cleaner apparatus 10 can include a lesser or greater number of chambers 400 depending upon design parameters. In one embodiment, there is one process chamber 400 for each pair of carrier stations 216, such that the carriers 212 and containers 12 from each pair are processed within the same chamber 400.

Referring to FIGS. 1 and 17-21, the rotor assembly 402 includes a housing 408, an internal rotor 410, a driver 412 operably coupled to the rotor 410, means for cleaning the container 12 and carrier 212, and means for drying the container 12 and carrier 212. The rotor housing 408 contains the rotor 410 and includes a face plate assembly 414 with at least one opening 416 that provides access to the rotor 410 therein. The faceplate assembly 414 includes a viewing window 418 and port or secondary duct 420, wherein the latter is cooperatively positioned with a primary duct 422 as part of the heating means (described below). Sealing elements 424 and opening covers 426 are also provided to minimize any fluid flow losses between the ports 420 and ducts 422. At a bottom portion of the housing 408, a discharge element 428 is provided to drain excess cleaning solution from the washing means and to exhaust air from the drying means. In one embodiment, the discharge element 428 comprises an air discharge opening 430 positioned above a processing fluid discharge opening 432. The discharge element 428 can include a baffle that facilitates the separation of the processing fluids from the warm air used to dry the container 12 and carrier 212. The housing 408 may also include an ion generator 434 that creates negative ions to reduce or eliminate static within the rotor assembly 402.

As shown in FIGS. 15-18, the rotor 410 comprises a front face plate 436, a rear face plate 438 and a plurality of frame members 440 extending between the front and rear plates 436, 438. In the embodiment shown in FIGS. 15-18, the frame members 440 are circumferentially spaced near a periphery of the face plates 436, 438. During rotation of the rotor 410, the frame members 440 act as blades or vanes to direct air and create an air pressure gradient within the rotor 410, with a low-pressure region created at the center of the rotor 410 and a high-pressure region created at the outer portions of the rotor 410. Preferably, the frame members 440 can be curved or angled to facilitate the pressure gradient upon rotation of the rotor 410. Alternatively, the frame members 440 are linear and the rotor 410 includes a number of separate blades to direct air and create the pressure gradient. Although the frame members 440 are shown in FIGS. 15-18 as extending the distance between the face plates 436, 438, the frame members 440 can be configured to extend only a portion of the separation distance between the face plates 436, 438. For example, a first frame member 440 can extend from the front plate 436 an extent of the separation distance and a second frame member 440 can extend from the rear plate 438 an extent of the separation distance. Consequently, the first and second frame members 440 form offset gaps with the respective face plate 436, 438.

Figure 17:
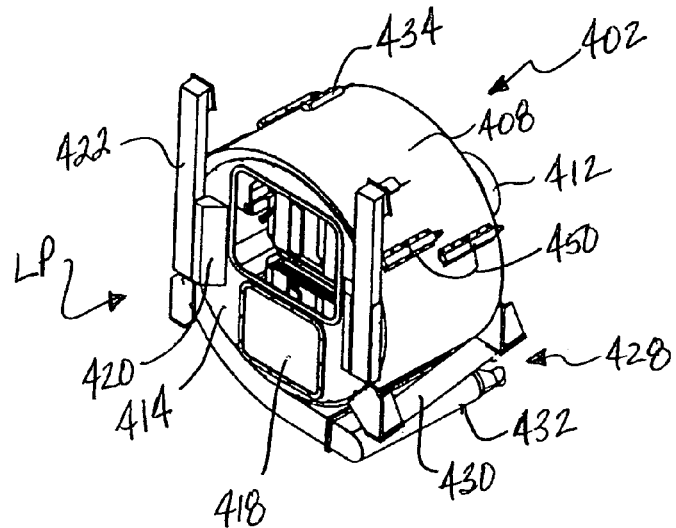
FIG. 17 is a perspective view of a rotor assembly of a process chamber of the cleaner apparatus.
Figure 18:
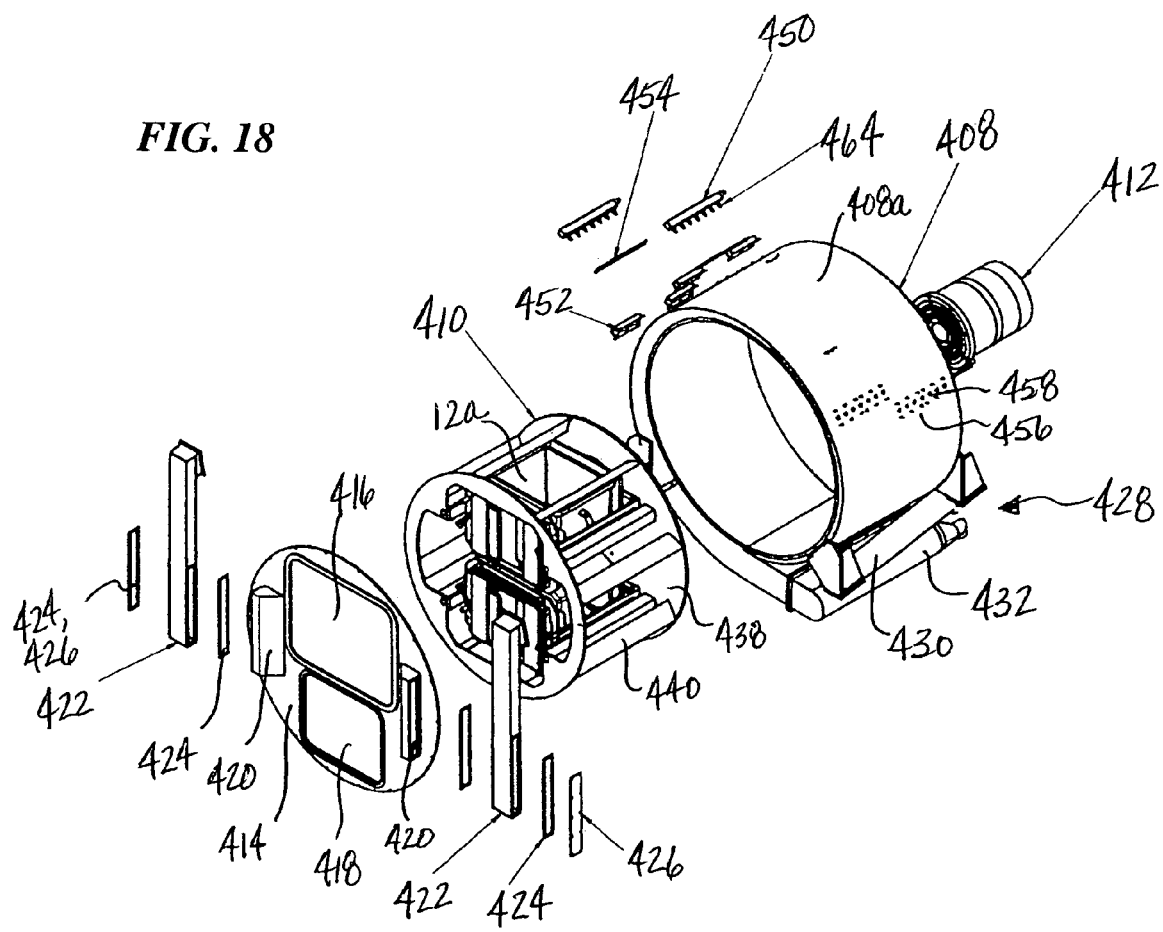
FIG. 18 is an exploded view of the rotor assembly of the process chamber.
Figure 19:
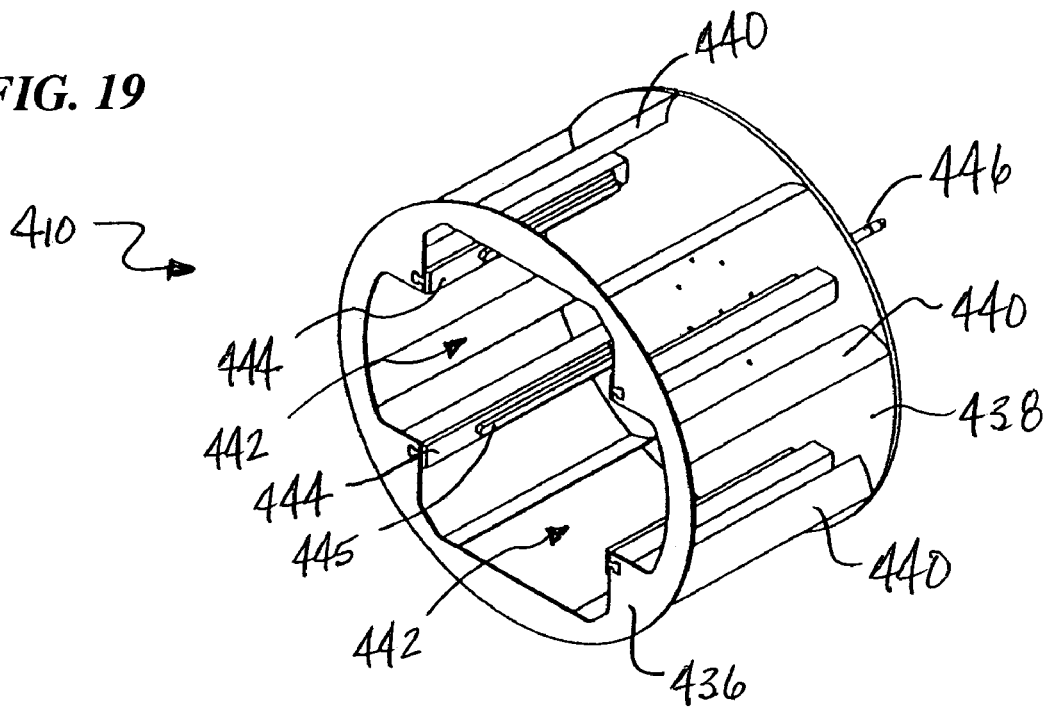
FIG. 19 is a perspective view of a rotor of the rotor assembly.
Figure 20:
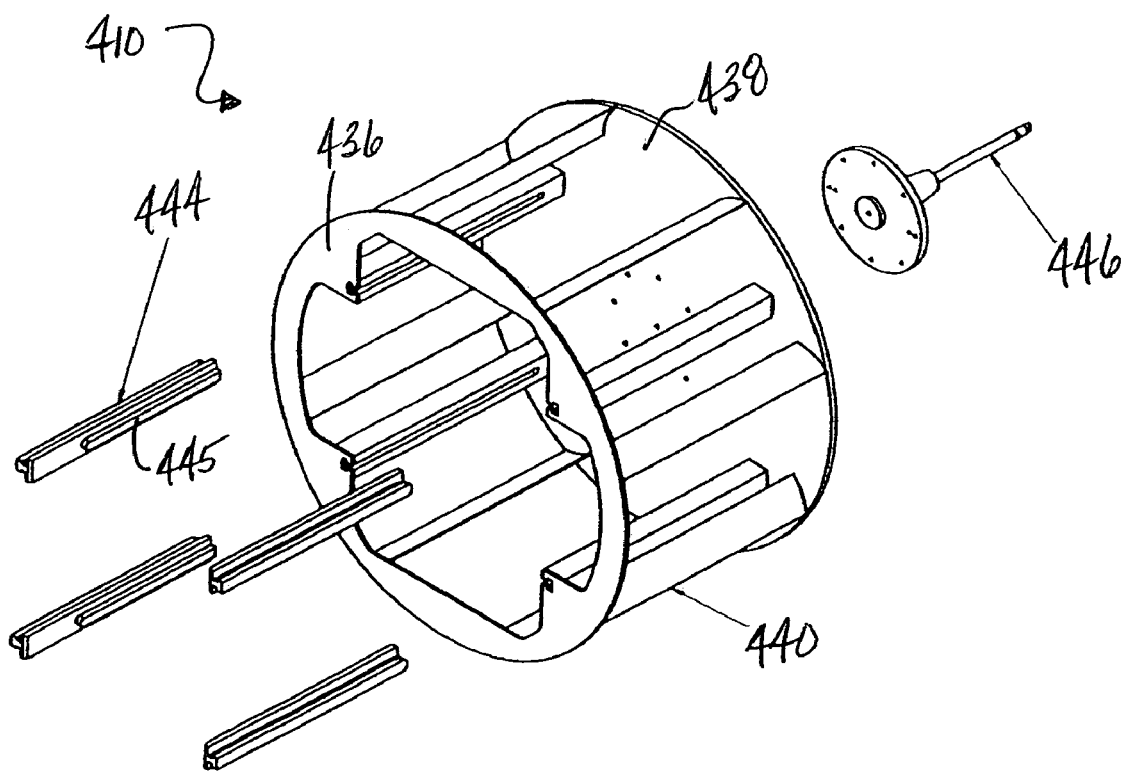
FIG. 20 is an exploded view of the rotor of the rotor assembly.
Figure 21:
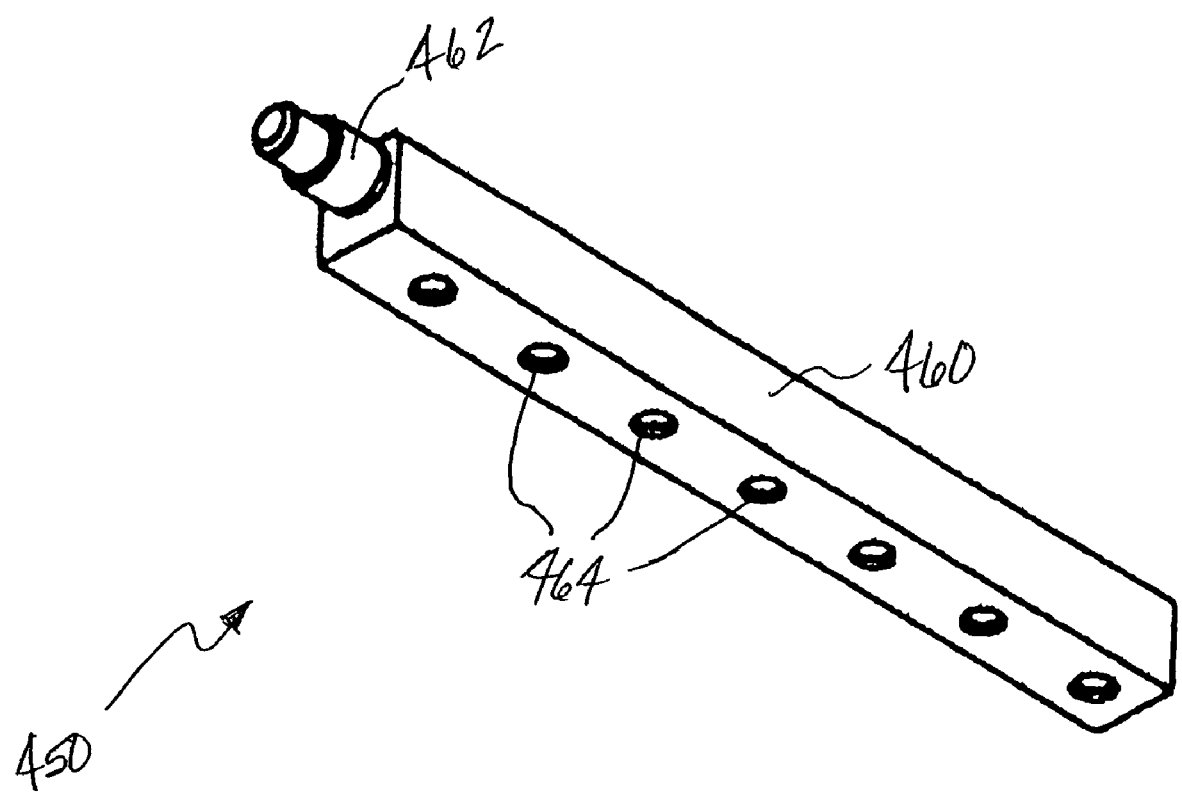
FIG. 21 is a perspective view of a manifold of the rotor assembly.

The rotor 410 also includes at least one receptacle 442 that receives the container 12 and the carrier 212 for processing. The receptacle 442 is defined in part by internal support members 444 (see FIGS. 19 and 20) that slidingly engage an extent of the carrier 212 upon insertion, and slidingly disengage the carrier 212 upon removal by the robot 300. Specifically, the support member 444 has a projection 445 that functions as a rail to engage and disengage a portion of the frame arrangement 230 of the carrier 212. As shown in FIGS. 19 and 20, the support members 444 are located radially inward of the frame members 440. A coupling 446 extends from the rear face plate 438 for operable connection to the driver 412. In the embodiment of FIGS. 14-18, the rotor 410 features two separate receptacles 442; however, the number of receptacles 442 varies with the design parameters of the process chamber 400. For example, the size of the rotor 410 can be increased to include three or more receptacles 442 or decreased to include a single receptacle 442. Preferably, the receptacles 442 are angularly spaced about a center axis of the rotor 410 to maintain the operational balance of the rotor 410. As an example, the two receptacles 442 are spaced approximately 180 degrees apart while three receptacles 442 would be spaced approximately 120 degrees apart. Described in a different manner, the receptacles 442 should be evenly spaced about the rotational axis of the rotor 410 to minimize vibration and imbalance during rotation.

Referring to FIGS. 14 and 15, where containers 12 and carriers 212 are in a loaded position LP within the process chamber 400, the rotor 410 has a depth that exceeds both the container 12 and the carrier 212 whereby the receptacle 442 receives both in their entirety. In the loaded position LP, the container 12 is located between the container door 12b and the rear face plate 438. That is, the container door 12b faces outward and is positioned proximate the opening of the receptacle 442. In the loaded position LP, the two containers 12 are positioned such that the interior of each carrier 12 is exposed. As a result, the rear walls of the containers 12 are in an opposed positional relationship and the front walls that receive the container door 12b face radially outward.

The process chamber 400 includes means for cleaning the container 12 and the container door 12b while the rotor 410 is rotating. A first processing fluid for cleaning the container 12 is distributed from a supply source (not shown) to a manifold 450. The supply source may include distribution lines, a pump, a supply reservoir and a flow metering device, such as a flow regulator. As shown in FIGS. 17 and 18, the manifold 450 is mounted to an outer wall 408a of the rotor housing 408 with a bracket 452 and a gasket seal 454. The rotor housing 408 includes an interface region 456 with openings 458 that extend through the outer wall 408a and that function as a passageway for the processing fluid delivered by the manifold 450. Referring to FIG. 19, the manifold 450 includes a housing 460 with an inlet 462 and at least one discharge port 464 cooperatively positioned with a nozzle 465 (see FIG. 18) that directs the processing fluid through the openings 458 and towards the rotor 410. Alternatively, the manifold 450 may include a linear discharge slot instead of the individual ports 464. Preferably, the nozzles 465 extend radially inward a distance into the rotor housing 408. Although a pair of manifolds 450 are shown coupled to each upper region of the rotor housing 408, the manifolds 450 can be positioned about the housing 408 and the number of manifolds 450 can be increased or decreased to provide sufficient distribution of the processing fluid. During operation, the cleaning means distributes a first processing fluid into the rotor housing 408 to clean the container 12, the container door 12b, and the carrier 212 as the rotor 410 rotates. In this manner, the cleaning means bathes the container 12 and the door 12b with the processing fluid. The manifold 450 and the openings 458 define a distribution passageway to direct the first processing fluid radially inward towards the rotor receptacles 442. The processing fluid can be a mixture of deionized water and a surfactant, a soluble compound that reduces the surface tension of liquids or the interfacial tension between a solid and a liquid. Typically, the surfactant is used only once and then discarded as waste product. Alternatively, the first processing fluid further includes a detergent or similar cleaning agent. In yet another alternative, the first processing fluid is deionized water or a similar fluid that is electrically neutral or non-polar.

In another embodiment, the external manifold 450 is eliminated and the cleaning means is configured such that the rotor housing 408 has at least one internal discharge port that is supplied with processing fluid by an internal fluid distribution system positioned within the rotor housing 408. The internal fluid distribution system can be a line extending from a fluid inlet in the housing 408 through the housing 408 to supply processing fluid to the discharge port. The discharge port can include an internal nozzle; however, it is understood that the internal nozzle cannot interfere with the rotation of the rotor 410.

The cleaning means is further configured to distribute a second processing fluid to rinse the container 12 and carrier 212 after the washing step is completed. The second processing fluid is deionized water or a similar fluid that is electrically neutral or non-polar. to rinse any surfactant or cleaning agent remaining from the first processing fluid. The second processing fluid is stored in a different supply source and is delivered to the manifold 450 by separate distribution lines. In this manner, the second processing fluid is distributed by the manifold 450 into the rotor assembly 402 as explained in the preceding paragraph. In another embodiment, the second processing fluid is supplied to a distinct dedicated manifold 450 and the first processing fluid is supplied to another distinct dedicated manifold 450 wherein each manifold 450 only distributes the processing fluid supplied. In this configuration, there is no mixing of the processing fluids within the manifold 450.

The process chamber 400 further includes means for drying the container 12 and the container door 12b. In a preferred embodiment, the drying means delivers warm air within the rotor 410. The drying means includes the air duct 422 and the port 420 of the faceplate 414, which collectively define a passageway for the air to be directed into a central portion of the rotor 410. The air duct 422 is in fluid communication with a supply line that delivers air from a source (not shown). As explained below in the text detailing the operation of the cleaner apparatus 10, the drying means delivers air to dry the container 12 and door 12b after the cleaning step has been completed. To aid the drying process, the drying means supplies air while the rotor 410 is rotating the container 12, the container door 12b and the carrier 212. Consequently, the drying means does not interfere with the rotation of the rotor 410. Despite the pressure gradient created by rotation of the support members 440, the air flows outward from the central region of the rotor 410 where it is injected via the port 420 past the container 12 and carrier 212 to the high pressure region near or beyond the periphery of the rotor 410.

As briefly explained above, the bottom portion of the housing 408 includes a discharge element 428. The discharge element 428 includes the air discharge opening 430 to exhaust air from the drying means and the fluid discharge opening 432 to drain the processing fluid prior to drying the container 12. Since rotation of the rotor 410 creates a pressure gradient, the discharge openings 430, 432 are preferably located at the periphery of the rotor 410. Although the discharge openings 430, 432 are shown bundled, they can be spaced from each other in the rotor housing 408. In one embodiment, the rotor 410 is angled or inclined relative to the housing 408 (e.g., 5-15° with respect to a horizontal axis (not shown)). Accordingly, the draining of the processing fluid is enhanced by gravity in this configuration. In another embodiment, the entire rotor assembly 402 is inclined relative to the surface to which the process chamber 400 is mounted to enhance drainage of the processing fluid. For example, the rotor assembly 402 is angled approximately 5-15 degrees to the horizontal support surface or ground.

As mentioned above, the process chamber 400 includes a door assembly 404 that seals the process chamber 400 during operation of the rotor assembly 402. The door assembly 404 is operably connected to the chamber housing 406. Referring to FIG. 1, the door assembly 404 includes a frame member 470 and a sealing window 472 that seals the opening 416 in the rotor assembly 402. The frame member 470 is operably connected to the process chamber 400 by a rail (not shown), and the door assembly 404 moves vertically along the exterior of the process chamber 400. After the containers 12 are loaded into the rotor assembly 402, the sealing window 472 is actuated inwardly towards the rotor assembly 402 to seal the opening 416 prior to processing. Once the processing is complete, the sealing window 472 is retracted (or actuated outwardly) from the opening 416 towards the frame member 470. Once the window 472 has been retracted a sufficient distance, the door assembly 404 is lowered, thereby rendering the receptacle 442 and the container 12 accessible through the opening 416 by the robot 300. The door assembly 404 is positioned behind the robot 300 such that it does not interfere with the operation of the robot 300, including the insertion and/or removal of containers 12 from the process chamber 400. Preferably, the door assembly 404 is powered by a pneumatic or hydraulic actuating system.

The operational aspect of the apparatus 10 includes a number of distinct steps to clean and dry containers 12, which are explained for each component of the apparatus 10. Initially, containers 12, which maybe contaminated with impurities, for example copper and/or cobalt, are delivered to the load port 100 either manually or automatically by a delivery tool, such as an automated guided vehicle, overhead transport system or robot.

Figure 22:
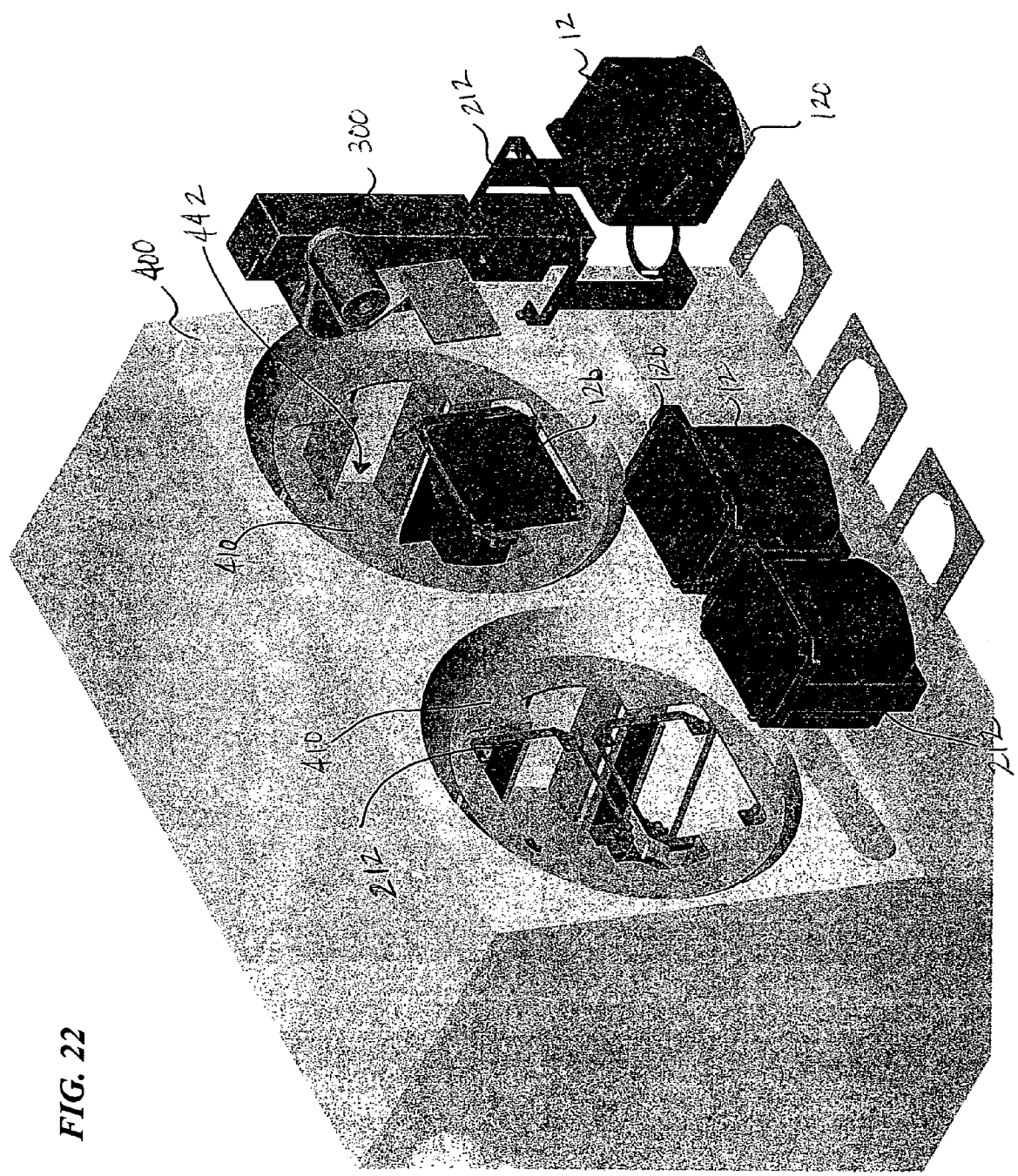
FIG. 22 is a schematic of the cleaner apparatus of the invention, showing the container in the load port assembly.

Referring to FIGS. 3 and 22, a container 12 is loaded into the fixture 120 of the load port 100 and then transferred to the carrier deck 200 while the housing door 26 is in an open position. The fixture 120 moves along the guide rail 130 to deliver the container 12 to the carrier 212 of the carrier deck 200. The door 26 of the enclosure 20 remains closed unless a dirty container 12 is being transferred from the load port 100 to the carrier deck 200, or a clean container 12 is being delivered by the carrier deck 200 to the load port 100.

Figure 23:
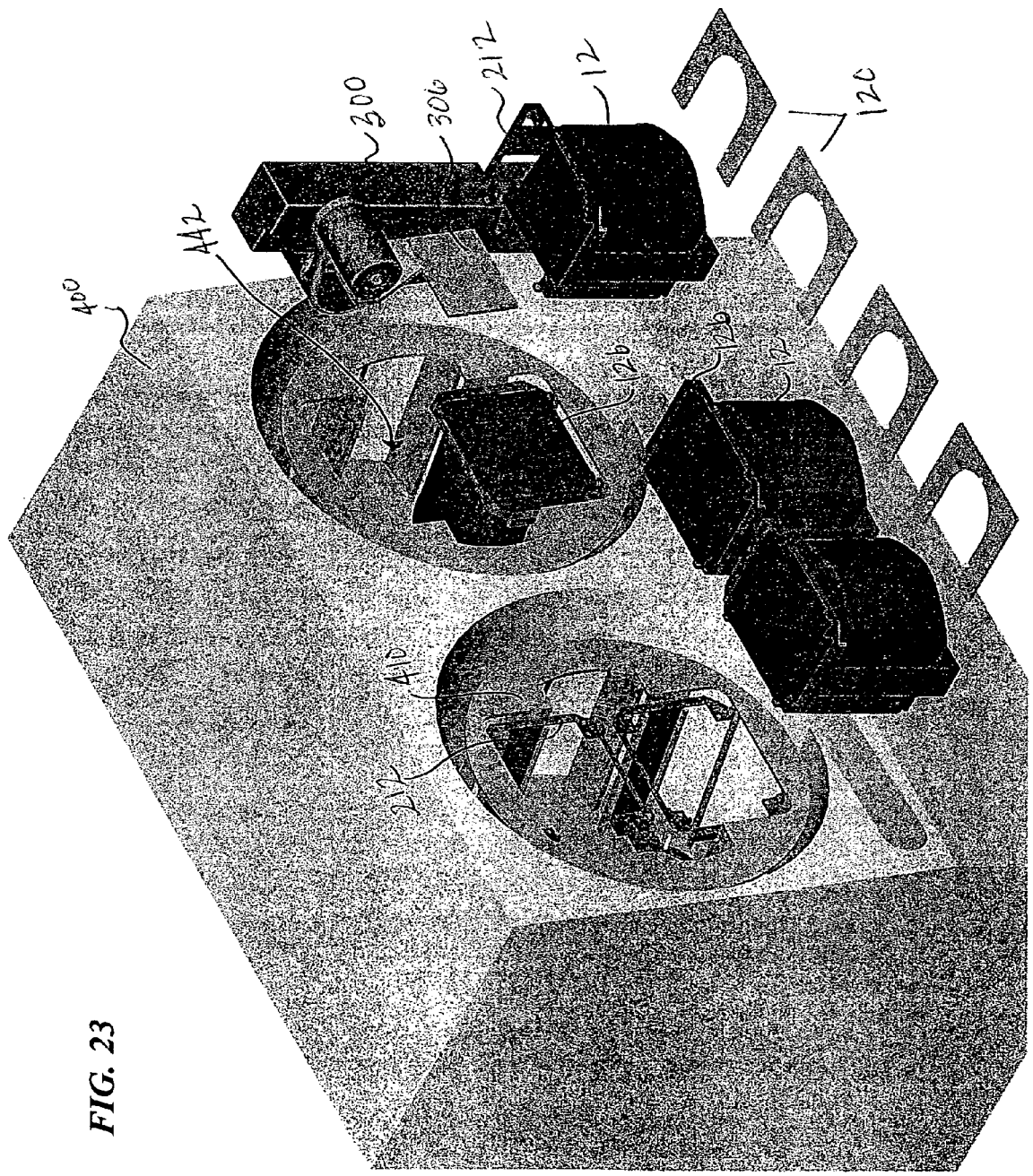
FIG. 23 is a schematic of the cleaner apparatus, showing the container in the carrier assembly.
Figure 24:
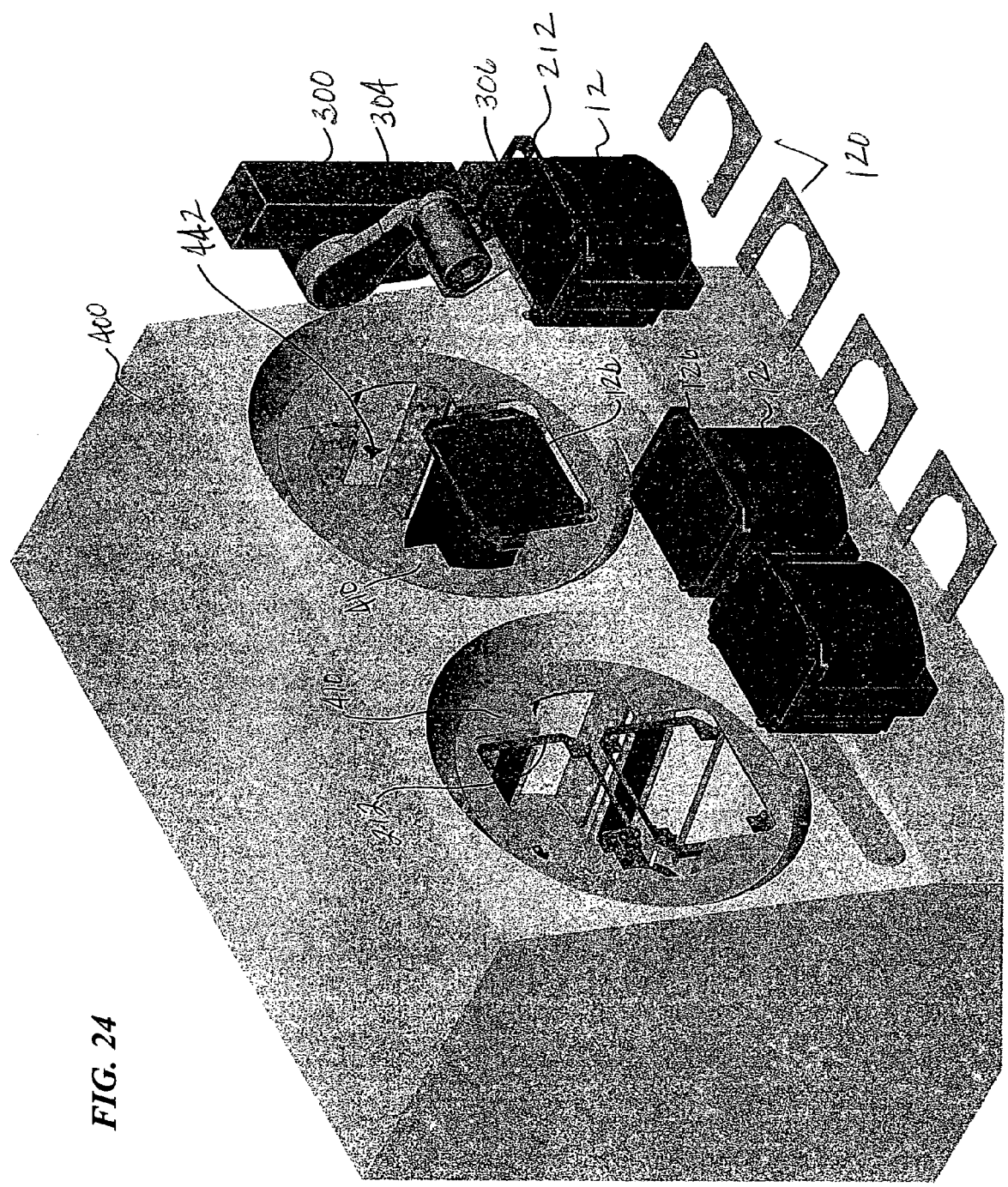
FIG. 24 is a schematic of the cleaner apparatus, showing a first end effector of the robot engaging the container.

Referring now to FIGS. 5-10 and as explained above, the carrier assembly 200 includes at least one station 216 having a carrier 212 that receives a container 12 for subsequent handling by the robot 300 and processing within the process chamber 400. The station 216 includes the carrier securing apparatus 220 that is activated to place the carrier 212 in the carrier docked position CDP, wherein the securing apparatus 220 secures the carrier 212 to the station 216 for reception of the container 12 (see FIG. 22). Specifically, the block 224 engages the slot 239 in the bottom carrier frame member 236 and the latch 225 is secured. Once the carrier docked position CDP is achieved, the container 12 is inserted into the receiver 234 of the carrier 212 by the fixture 120 of the load port 100, as shown in the schematic of FIG. 23. Preferably, the container 12 is positioned within the receiver 234 such that the door 12b is oriented towards the robot 300 and the a rear wall of the container 12 is oriented towards the load port 100. In this manner, the container door 12b faces the process chamber 400 and the rear wall of the container 12 faces away from the process chamber 400.

Figure 25:
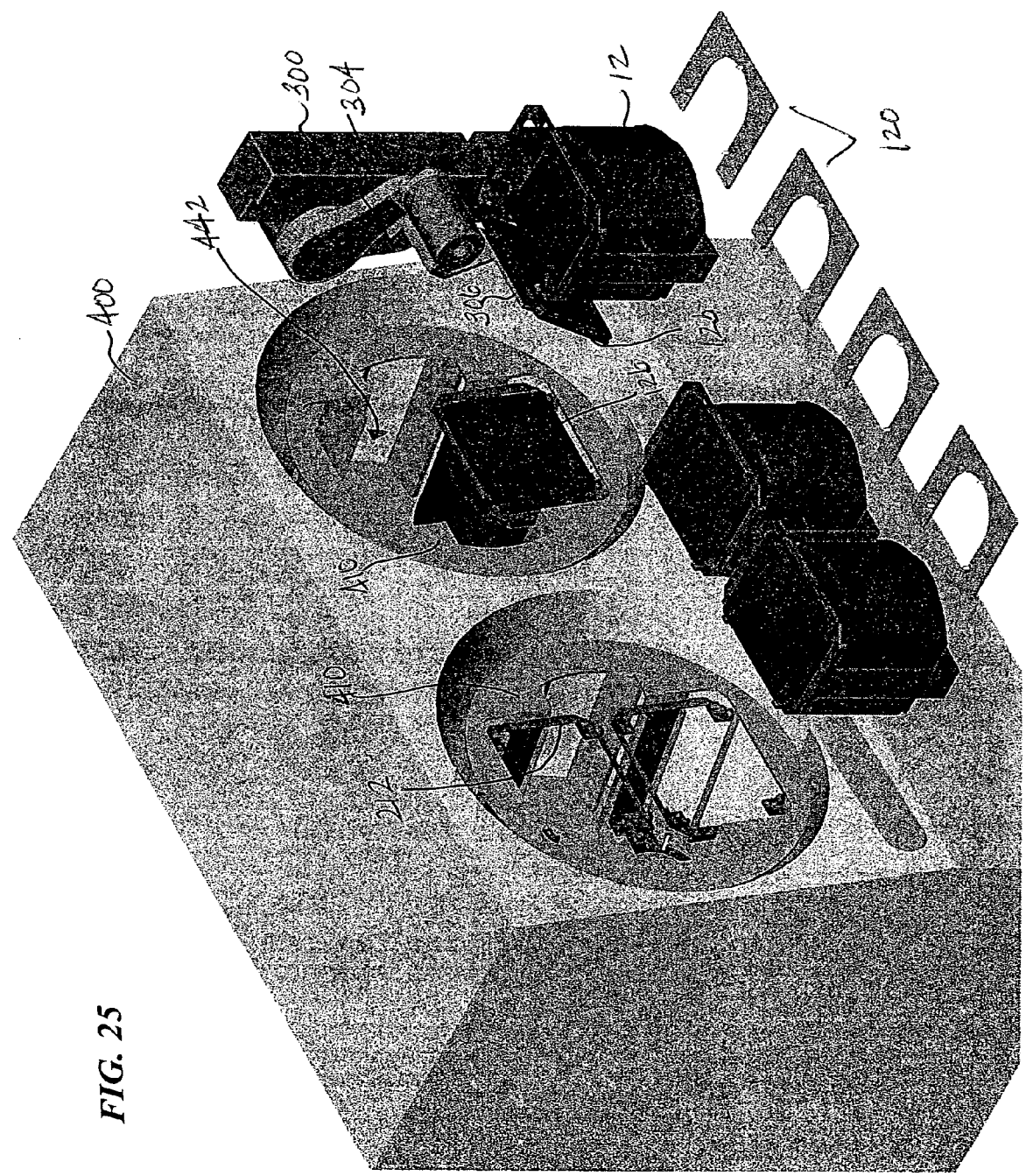
FIG. 25 is a schematic of the cleaner apparatus, showing the first end effector of the robot removing a door from the container.
Figure 26:
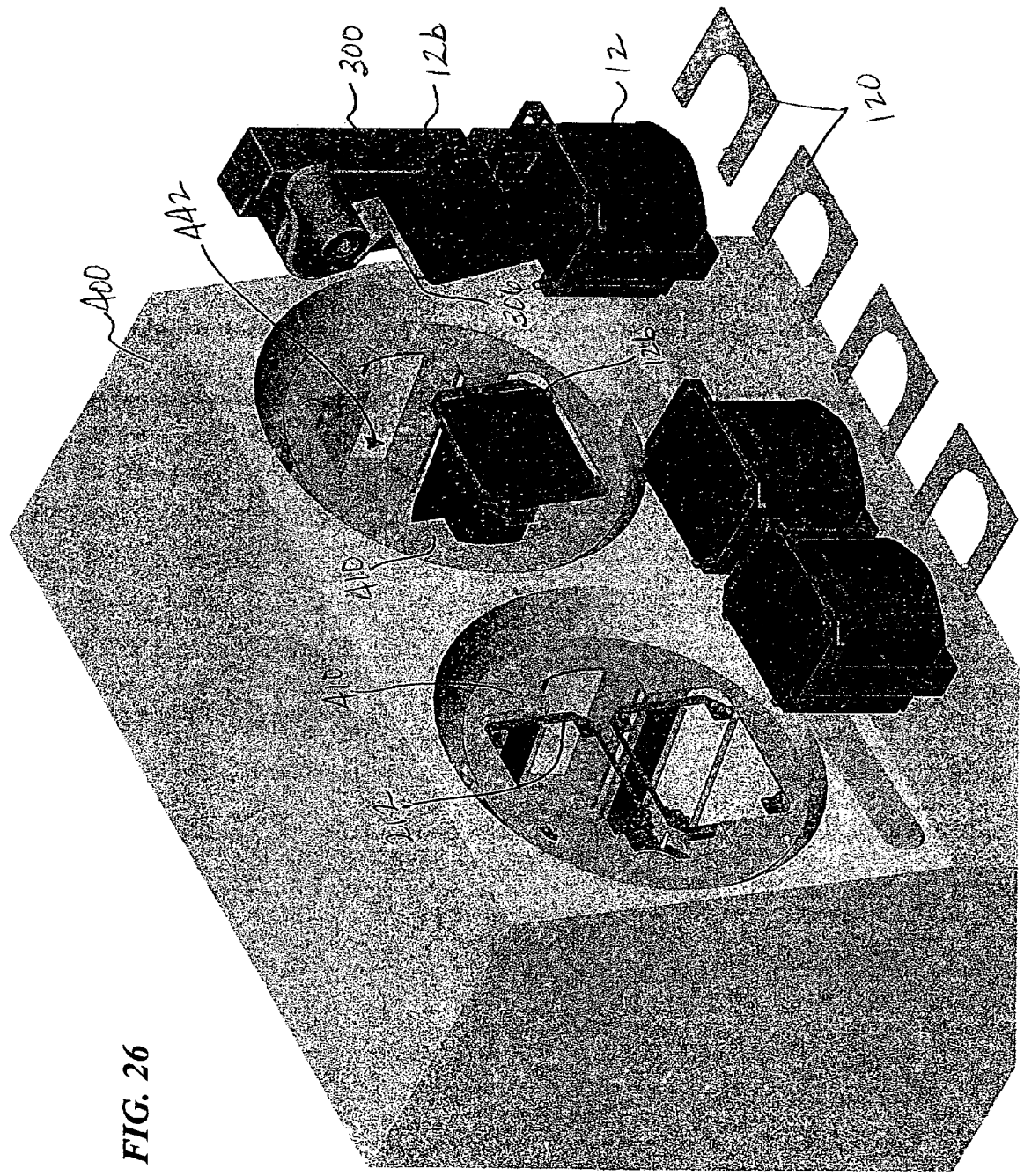
FIG. 26 is a schematic of the cleaner apparatus, showing the first end effector of the robot moving the container door above an upper portion of the carrier.
Figure 27:
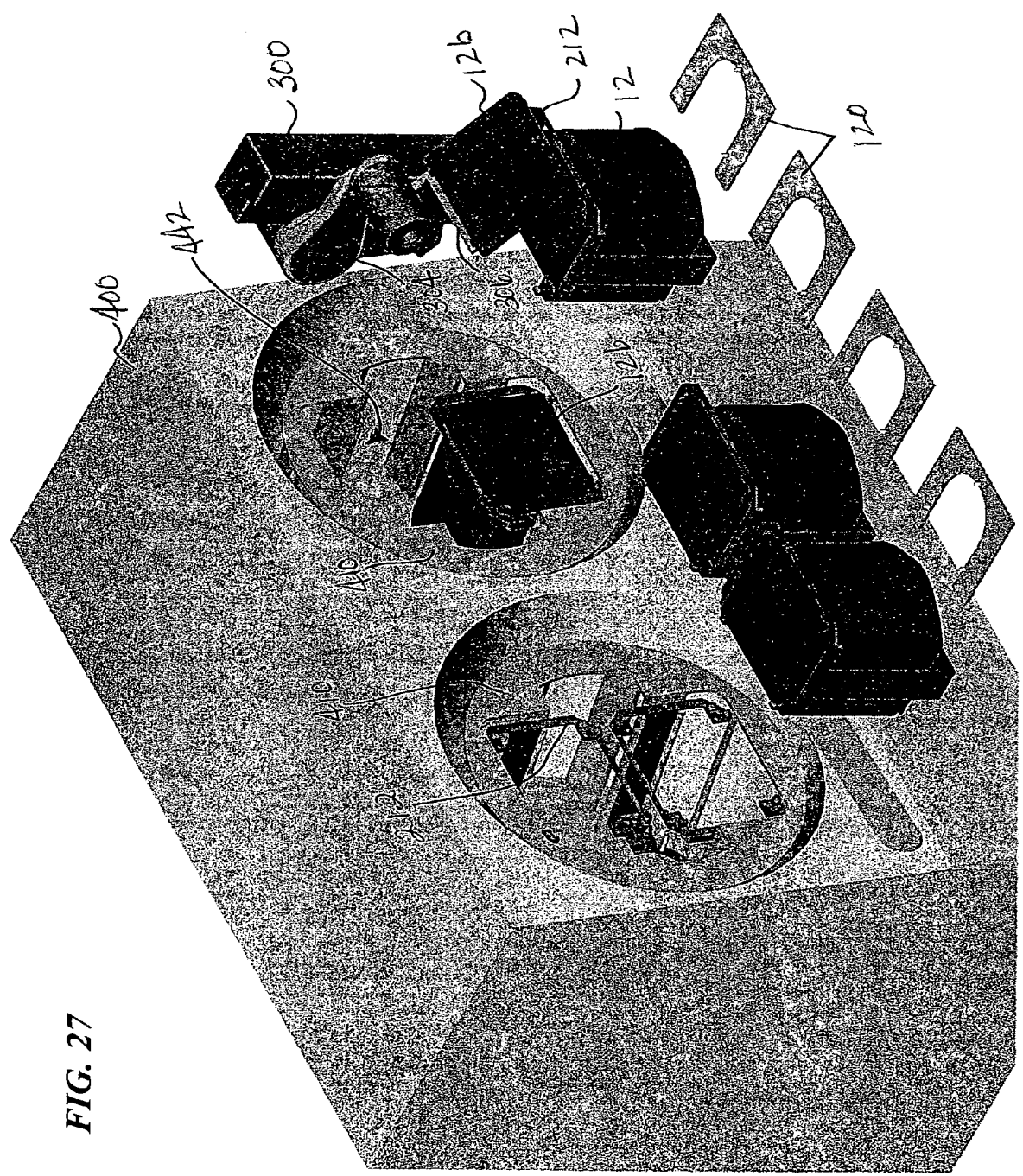
FIG. 27 is a schematic of the cleaner apparatus, showing the first end effector of the robot moving the container door above the upper portion of the carrier.
Figure 28:
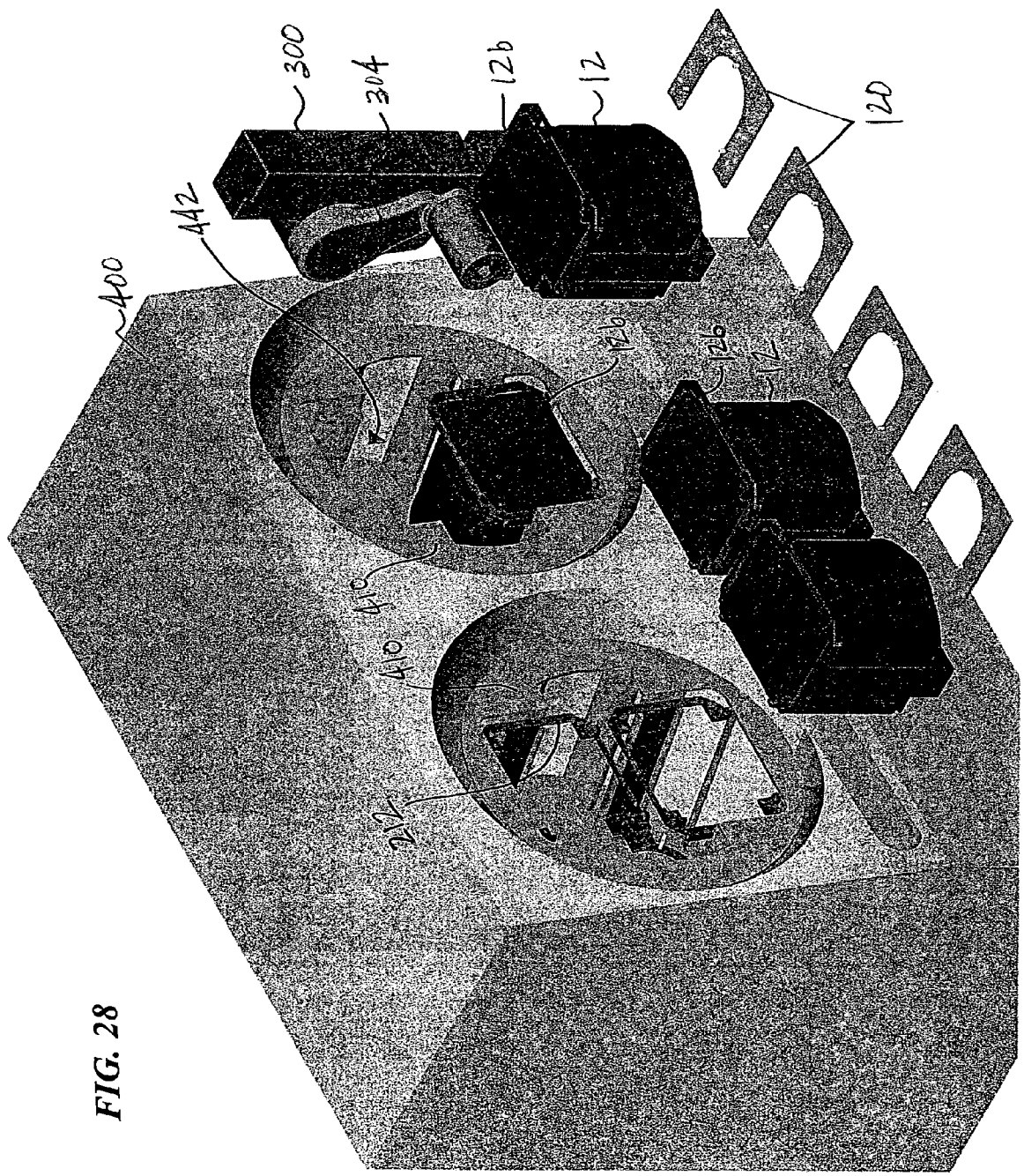
FIG. 28 is a schematic of the cleaner apparatus, showing the first end effector of the robot placing the container door on the upper portion of the carrier.
Figure 29:
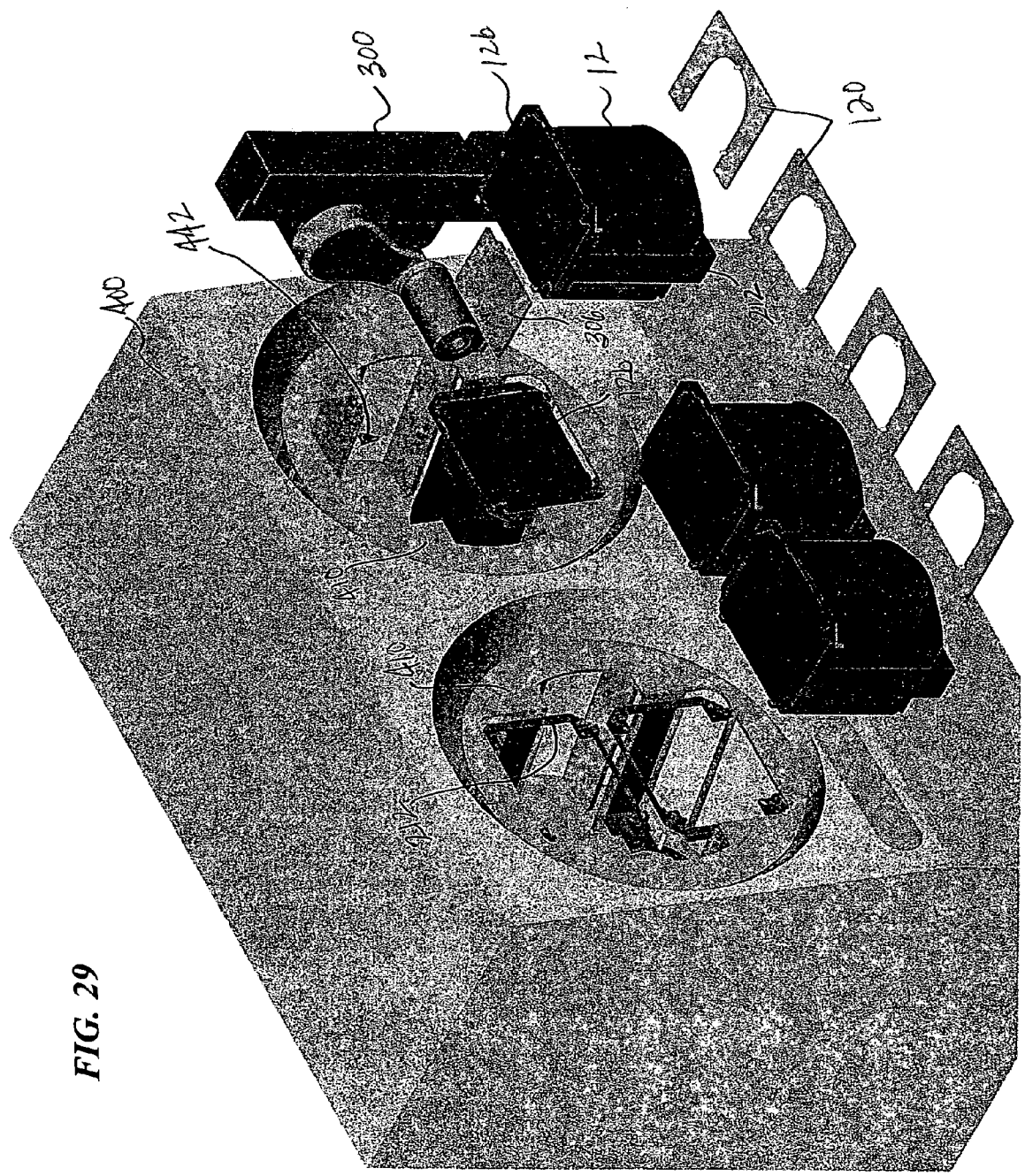
FIG. 29 is a schematic of the cleaner apparatus, showing the first end effector of the robot moving away from the container and the carrier.

After the container 12 is positioned within the receiver 234, the robot 300 is activated to unlock and remove the door 12b from the container 12 as shown in FIGS. 24-27. Specifically, the robot 300 moves along the carrier assembly 200 to the predetermined carrier station 216 to engage the container 12. The robot actuator arm 304 is positioned such that the first end effector 306 approaches and then engages the container door 12b. As explained above and as shown in FIG. 24, the first end effector 306 includes a key 392 that unlocks the container door 12b. Once the door 12b is unlocked, the first end effector 306 is further positioned such that the suction element 394 engages the outer surface of the door 12b and then the internal vacuum system 333 is activated to create a partial vacuum in the interface region between the element 394 and the surface of the door 12b. After a sufficient vacuum level is obtained, the door 12b is removed from the container 12 through the sealing engagement provided by the first end effector 306. Referring to FIGS. 25 and 26, through movement of the actuator arm 304 and the seal provided by the first end effector 306, the door 12b is moved away from the container 12 and placed onto the upper carrier frame member 242. In one embodiment, the door 12b is moved or pivoted approximately 270 degrees from the container 12 to the upper frame member 242. Depending upon the structural configuration of the upper frame member 242, including the brackets 243, the first end effector 306 can horizontally or angularly position the door 12b on the frame member 242. As shown in FIGS. 27 and 28, when the container door 12b is placed on the upper frame member 242, the inner surface of the door 12b faces outward or is exposed, while the outer door surface faces inward towards an upper outer surface of the container 12. After the door 12b is received by the upper frame member 242, the vacuum provided by the internal vacuum system 333 is eliminated and the first end effector 306 disengages the door 12b (see FIG. 29). In a preferred embodiment, the first end effector 306 disengages the door 12b by moving horizontally towards the process chamber 400 a distance sufficient to clear the carrier 212 and the door 12b.

Once the first end effector 306 disengages and clears the door 12b (see FIG. 29), the container securing means 244 is activated to secure the container 12 within the receiver 234 and the door 12b to the carrier 212. Specifically, upper latch 248 of the securing means 244 is actuated to engage the inner surface of the door 12b and the lower latch 252 is actuated to engage a lower portion of the container 12. The engagement provided by the securing means 244 places the container 212 and the carrier 12 in the container secured position CSP, which is necessary for further handling by the robot 300. As explained above, the carrier 212 and the container 12 each include additional cooperating structure that facilitates the container secured position CSP. The steps for securing the container 12 in the carrier 260 are similar; however, the clamp mechanism 274 is actuated before the robot 300 removes the door 12b and the latch mechanism 275 is activated.

Figure 30:
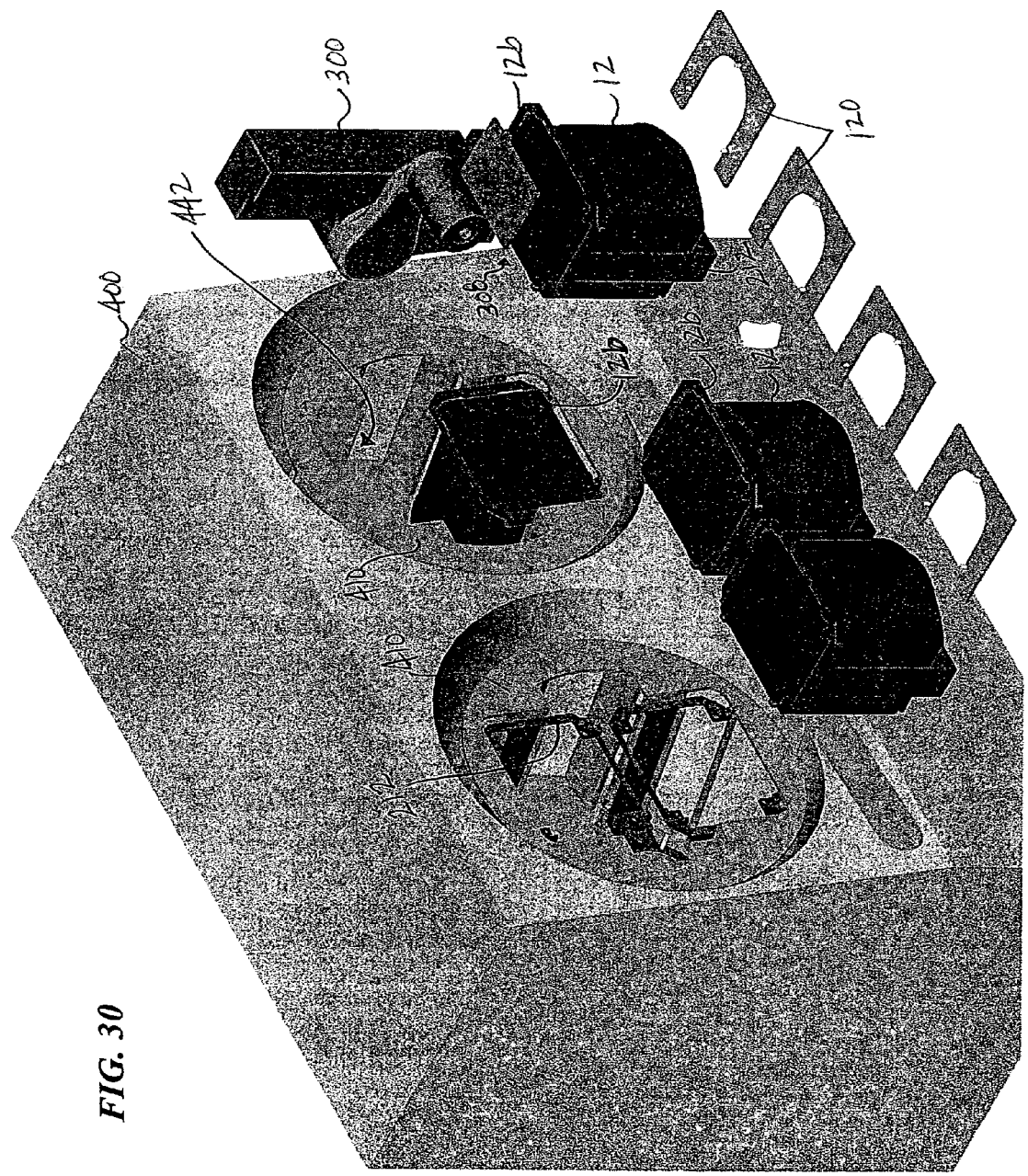
FIG. 30 is a schematic of the cleaner apparatus, showing a second end effector of the robot engaging the container and the carrier.
Figure 31:
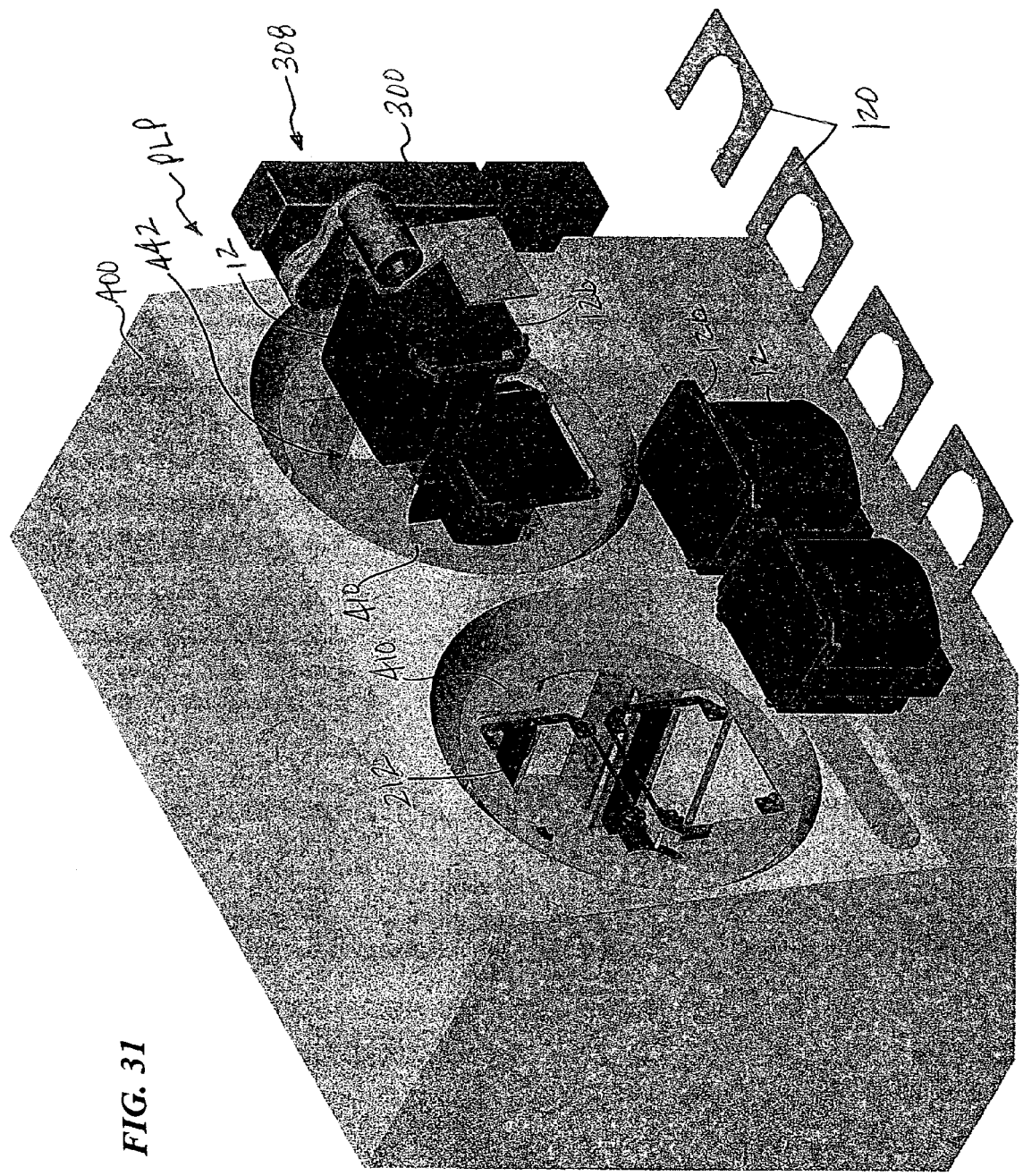
FIG. 31 is a schematic of the cleaner apparatus, showing the robot rotating the container and the carrier into a pre-loading position.

With reference to FIGS. 30 and 31, once the container 12 is in the container secured position CSP, the robot 300 is again activated such that the second end effector 308 engages the carrier 212 to move the carrier 212 and the container 12 from the carrier assembly 200 to the process chamber 400. Specifically, the robot actuator arm 304 is positioned such that the clamp assembly 309 of the second end effector 308 engages a portion of the carrier 212. Referring to FIG. 30, once the clamp 309 securely engages or grasps the carrier 212, the actuator arm 304 is moved upward along the vertical support 302 wherein the carrier 212 and the container 12 are pivoted approximately ninety degrees to place the container 12 and the carrier 212 into a pre-loading position PLP (see FIG. 31) for the process chamber 400. The pivotal movement of the carrier 212 and the container 12 can occur during or after the vertical lifting provided by the robot 300. In the pre-loading position PLP, the container 12 and the carrier 212 are vertically positioned proximate the upper receptacle 442 of the rotor assembly 402, and the upper receptacle 442 is aligned with the opening 416 in the faceplate 414. One of skill in the art recognizes that the upper receptacle 442 is dependent upon the angular position of the rotor assembly 402, and that each receptacle 442 will be positioned to receive the container 12 and the carrier 212 upon rotation of the rotor assembly 402. Although the process chamber door assembly 404 is not shown in FIG. 31, the container 12 and the carrier 212 are also positioned proximate the opening 416 in the faceplate assembly 414. Furthermore, in the pre-loading position PLP, the inner surface of the container door 12b faces outward towards the carrier assembly 200 and the interior of the container 12 is exposed and is visible from a vantage point about the process chamber 400.

Figure 32:
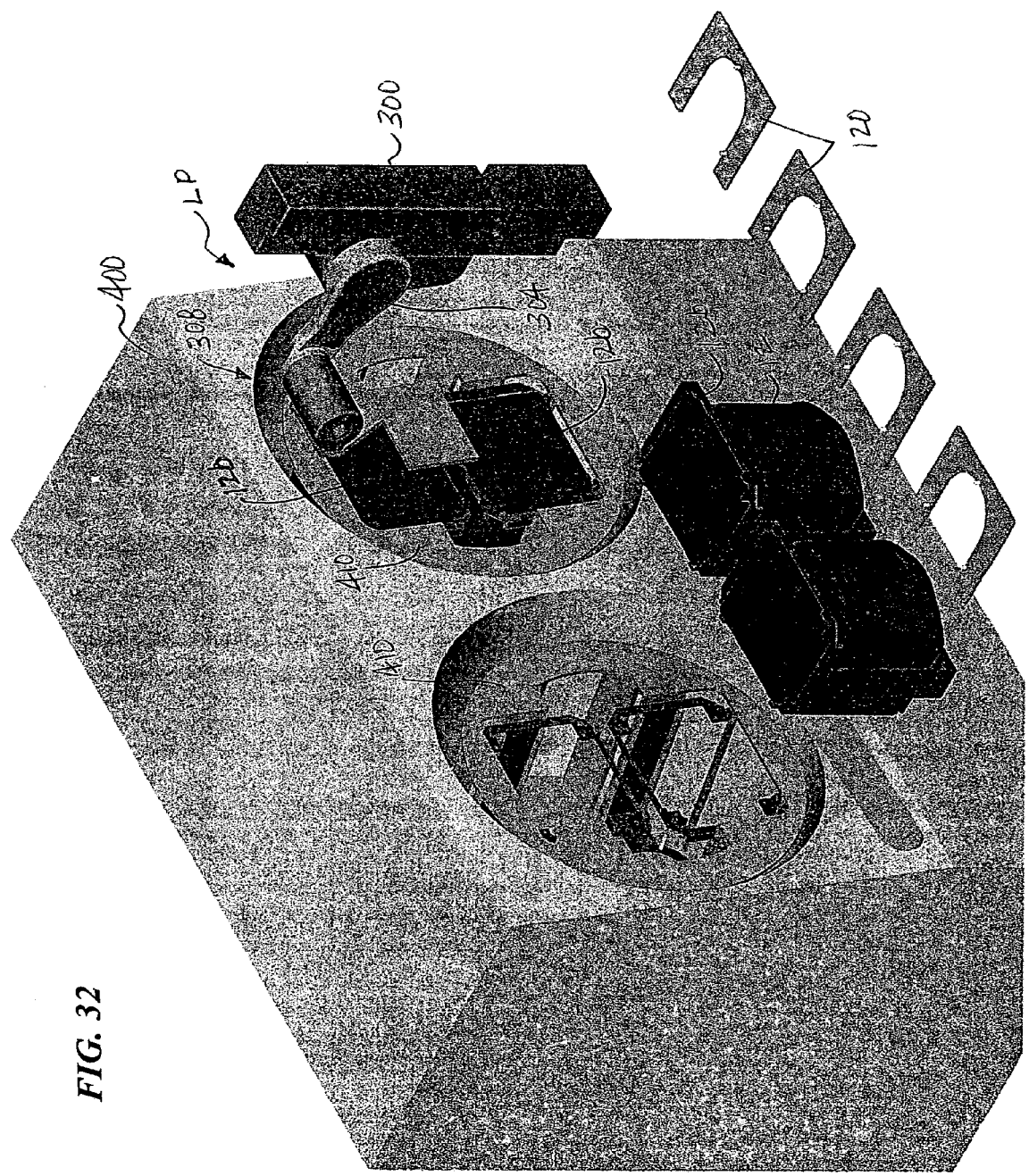
FIG. 32 is a schematic of the cleaner apparatus, showing the robot loading the container and the carrier into a receptacle of the process chamber; and, FIG. 33 is a schematic of the cleaner apparatus, showing the container and the carrier loaded in the process chamber and the robot positioned a distance from the process chamber.

Referring to FIGS. 17, 18 and 32, upon obtaining the pre-loading position PLP, the robot 300 loads the container 12 and the carrier 212 into the upper receptacle 442 to define a loaded position LP for processing the container 12 within the process chamber 400. As explained above, the internal support members 444 of the receptacle 442 slidingly engage a portion of the frame arrangement 230 of the carrier 212 upon insertion by the robot 300. Since the container 12 is positioned within the carrier frame arrangement 230, the support members 444 preferably do not make contact with the container 12 or door 12b. To arrive at the loaded position LP, the second end effector 308 provides secured engagement between the robot 300 and the carrier 212.

Figure 33:
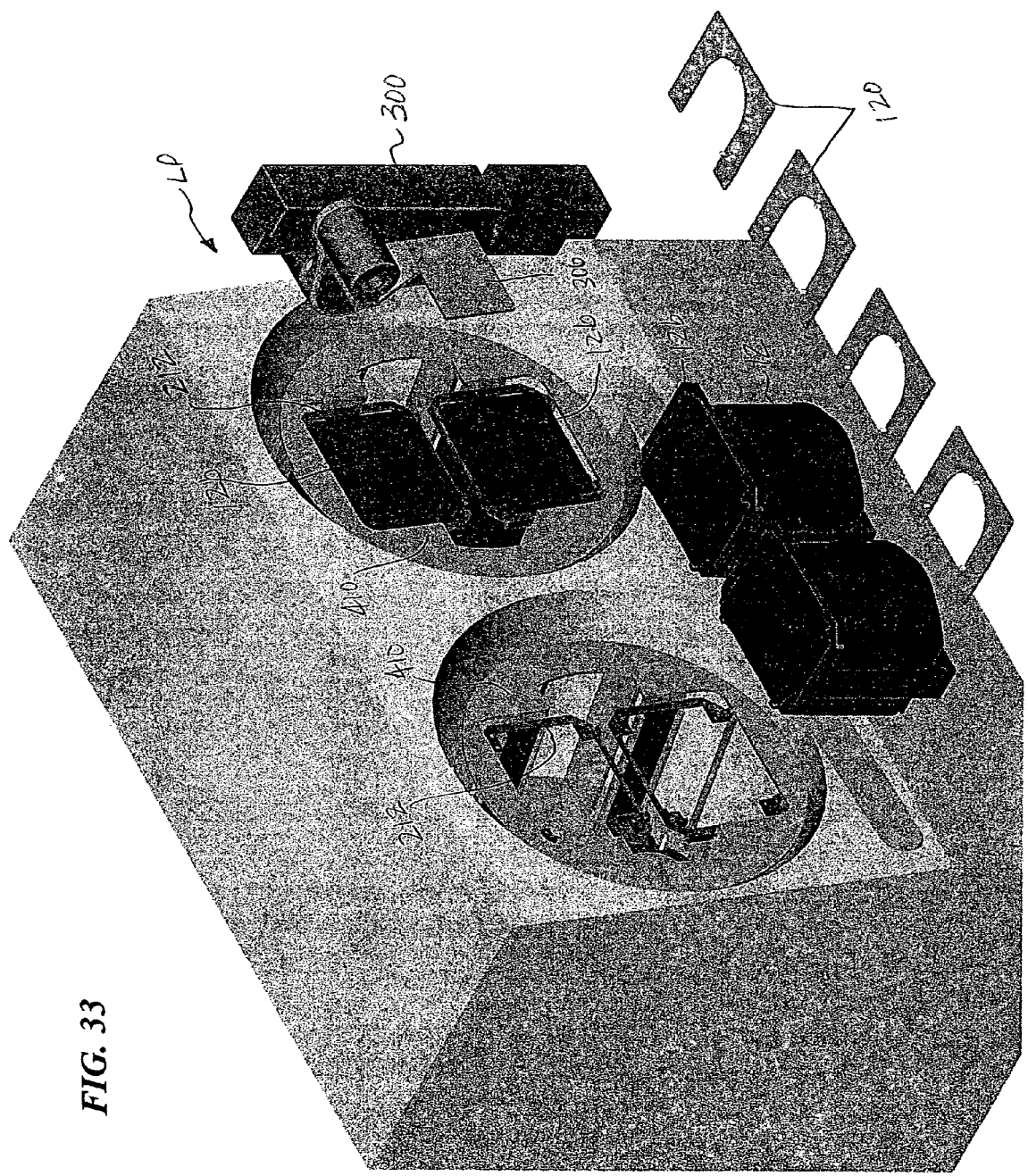

With reference now to FIG. 33, once the loaded position LP is achieved, the second end effector 308 disengages the carrier 212 and the actuator arm 304 moves away from the rotor assembly 402 and the process chamber 400. To load a second container 12 and carrier 212, the rotor 410 is rotated approximately 180 degrees to place the loaded receptacle 442 below an empty upper receptacle 442. The above described steps are repeated until a second pre-loading position is reached. From that position, the robot 300 loads the second container 12 and carrier 212 into the empty receptacle 442 to define a second loaded position LP wherein both receptacles 442 are loaded with containers 12 for cleaning and drying. In this embodiment, two dirty containers 12 are processed at the same time within the process chamber 400 to increase the efficiency of the apparatus 10. When the robot 300 has moved a sufficient distance from the process chamber 400, the door assembly 404, including the frame member 470, moves along the chamber housing 406 to bring the sealing window 472 into engagement with the opening 416 in the face plate assembly 414. In the loaded position LP, the inner surface of the container door 12b faces outward or toward the robot 300 and the interior of the container 12 faces radially outward or towards the periphery of the rotor 410. In another embodiment, the faceplate assembly 414 is configured with two openings 416 wherein the robot 300 loads a first carrier 212 and container 12 into one of either an upper or lower receptacle 442 and then loads a second carrier 212 and container 12 into the other of the upper or lower receptacle 442.

After the process chamber is loaded and the door assembly 404 seals the faceplate assembly 414, the driver 412 rotates the rotor 410 thereby creating a pressure gradient in the rotor assembly 402, with a higher pressure region being created at or beyond the periphery of the rotor 410 and a lower pressure region being created within the periphery of the rotor 410 (and particularly at the center of the rotor 410). The container 12 and the carrier 212 are positioned within the lower pressure region created by rotation of the rotor 410 to define a processing position. Once the rotor 410 is rotating at a sufficient speed, the cleaning means distributes a first processing fluid, such as deionized water and a surfactant, through manifold 450 and into contact with the container 12, the door 12b and the carrier 212. The surfactant acts as a wetting agent which helps to remove loosely adhered particles or contaminants from the container 12 and door 12b. A second processing fluid, typically deionized water, is sprayed into the rotor 410 by the manifold 450 to rinse the container 12 and the carrier 212. Near the completion of the rinsing stage, the rotational speed of the rotor 410 is increased to further increase the pressure gradient between the exterior and interior regions of the rotor 410. The increased pressure gradient resulting from the increased rotational velocity facilitates the flow of the first and second processing fluids across the container 12 and the door 12b. Essentially, the process fluids are "slung" from the container 12 and the door 12b. This centrifugal force ensures that the container 12 and door 12b are thoroughly cleansed and also assists in draining the process fluids from the rotor 410. The rotor housing 408 functions as a containment barrier for the processing fluids that flow outward of the rotor 410, wherein the discharge element 432 dispenses excess processing fluids from the rotor assembly 402. Alternatively, the rotational speed of the rotor 410 is increased after the completion of the rinsing stage or as the initial step in the drying stage explained below.

Next, the drying means delivers air through the duct 422 and the port 420 into a central region of the rotor 410 which corresponds to the low pressure region of the rotor 410. Preferably, the air is heated to a predetermined temperature before its delivery. Due to the rotation of the rotor 410 and the resultant pressure gradient, the warm air flows across the container 12, the door 12b, and the carrier 212 and then outward of the rotor 410. In this manner, the warm air flows from the low pressure region past the container 12 and door 12b to the high pressure region beyond the periphery of the rotor 410. While a substantial amount of the processing fluids are removed from the container 12 and the door 12b during the rinse stage, the flowing warm air dries any processing fluid remaining on the container 12 and the door 12b. Excess processing fluid is separated from excess warm air wherein the processing fluid is drained from the rotor assembly 402 by the discharge 432 and the remaining warm air is exhausted by the discharge 430. The container secured position CSP ensures that the container 12 and door 12b remain securely connected to the carrier 212 during the rotation of the rotor 410. The rotation of the rotor 410, the subsequent cleaning and rinsing with the first and second fluids and the drying with warm air collectively defines a processing stage for the container 12 and door 12b.

Upon completion of the processing stage, the robot 300 removes the container 12 and door 12b from the receptacle 442 for transfer back to the carrier assembly 200. Specifically, the rotor 410 is positioned such that a first receptacle 442 is aligned with the opening 416 in the faceplate 414 to define an unloading position. Next, the door assembly 404 is moved away from the receptacle 442 and downward along the chamber housing 406 to disengage the sealing window 472 from the opening 416 in the face plate assembly 414, thereby exposing the receptacle 442. The robot 300 is positioned such that the second end effector 308 securely engages the carrier 212 for removal of the container 12 and the door 12b from the receptacle 442. Once the container 12 and the door 12b are removed from the process chamber 400, the robot 300 rotates them in the opposite direction from that used to arrive at the pre-loading position for return, along with the carrier 212, to the appropriate carrier station 216. For example, if the robot 300 rotates the container 12 and the carrier 212 ninety degrees clockwise to arrive at the pre-loading position, the robot 300 rotates both ninety degrees counter-clockwise for proper orientation for engagement with the carrier station 216. While the container 12 and door 12b are moved between the carrier assembly 200 and the process chamber 400, the container 12 and the door 12b remain in the container secured position CSP to prevent dislodging of either structure.

The robot 300 returns the container 12 and the carrier 212 to the carrier station 216 wherein both are placed in the carrier docked position CDP for further handling by the robot 300. Initially, the second end effector 308 disengages the carrier 212 for further handling. Next, the container securing means 244 is released, allowing the actuator arm 304 to be moved such that the first end effector 306 engages the door 12b for reassembly of the container 12. As explained above, the suction element 394 permits the first end effector 306 to sealingly engage the door 12 and provide pivotal movement of the door 12b by the first end effector 306. The actuator arm 304 is moved such that the first end effector 306 brings the door 12b into re-engagement with the container 12. At this point, the suction element 394 disengages and the key 392 can be utilized to lock the door 12b to the container 12 to complete the reassembly of the container 12. The robot 300 pivots the container door 12b in the opposite direction from that used to bring the door 12b into engagement with the upper carrier frame member 242.

While the housing door 26 is in an open position, the fixture 120 of the load port 100 removes the clean, dried and re-assembled container 12 from the carrier 212 of the carrier deck 200. After the processed container 12 is removed from the deck assembly 210, the door 26 is closed and the processed container 12 is manually or automatically returned to service from the fixture 120. A dirty container 12 is then provided to the load port 100 wherein the fixture 120 engages the dirty container 12 for further processing as described in the preceding paragraphs.

While the embodiment of the apparatus 10 shown in the Figures includes two distinct process chamber 400, each having two receptacles 442, the apparatus 10 can be configured with a single process chamber 400 with one receptacle 442. In this configuration (not shown), the carrier assembly 200 includes a single station 216 whereat the robot 300 disassembles a container 12, inserts it and the carrier 212 into the receptacle 442, removes the container 12 and the carrier 212 once the cleaning and drying steps are completed, and then reassembles the container 12 for return to service by the load port 100. In another alternate configuration (not shown), the apparatus 10 includes a single process chamber 400 with two or more receptacles 442, wherein the robot 300 operates in a similar manner to insert and remove a container 12 and carrier 212 in each receptacle 442 of the process chamber 400.

In the embodiment of the cleaner apparatus 10 shown in the Figures, the two process chambers 400 provide for continuous cleaning and drying of multiple dirty containers 12. In this manner, four dirty containers 12 are initially supplied to the load port 100 and the carrier assembly 200 for processing within the process chamber 400. Once cleaned, the four processed containers 12 are returned to service. Accordingly, dirty containers 12 are continuously cleaned and dried in a sequential manner that increases the efficiency and throughput of the apparatus 10. An example of the continuous, automated operating process is provided below with the carrier 212.

From an initial starting point, where the apparatus 10 contains six empty carriers 212 (two loaded into a process chamber 400 and four positioned at the carrier stations 216), both outer doors 114 of the load port 100 are lowered and a dirty container 12 is received by each of the four fixtures 120. Both outer doors 114 are then raised to close the load port 100. Both doors 26 of the enclosure 20 are then raised to permit the four fixtures 120 to deliver the containers 12 to the carriers 212 of the carrier assembly 200, wherein each carrier 212 is positioned at a carrier station 216 in the carrier docked position CDP. Once the carriers 212 receive the containers 12, the doors 26 are closed. For each carrier 212, the lower clamp assembly 274 is actuated to secure the container 12 within the carrier receiver 234. The robot 300 then utilizes the first end effector 306 to engage and remove the door 12b from the container body 12a, whereupon the first end effector 306 positions the door 12b on the top member 242 of the carrier 212. Next, the door securing means 244 is activated to secure the door 12b to the frame member 242. The removal and subsequent securement of the door 12b is conducted by the robot 300 for each assembly of container 12 and carrier 212 to bring each combination of container 12, door 12b and carrier 212 to the container secured position CSP. Where the carrier 260 is utilized instead of the carrier 212, the clamp mechanism 274 is actuated before the robot 300 removes the door 12b and the latch mechanism 275 is activated. As such, the clamp mechanism 274 operates independently of the latch mechanism 275.

The robot 300 then utilizes the second end effector 308 to engage and elevate the first container 12 and carrier 212 combination while the first process chamber door assembly 404 is opened to expose an empty, first receptacle 442 of the rotor 410. Once the first container 12 and carrier 212 combination is properly aligned, the robot 300 inserts both into the first receptacle 442. As the robot 300 proceeds to engage a second container 12 and carrier 212 assembly, the rotor 410 is rotated approximately 180 degrees to place an empty, second receptacle 442 above the first receptacle 442 (which is loaded with the first container 12 and carrier 212 assembly). The robot 300 utilizes the second end effector 308 to engage and elevate the second container 12 and carrier 212 combination and inserts both into the second receptacle 442. At this point, the door assembly 404 is closed and processing of the first two container 12 and carrier 212 assemblies begins. As explained in detail above, during processing, the rotor 410 is rotated to create a pressure gradient and the cleanings means is activated to deliver a processing fluid, followed by the drying means drying the container 12 and carrier 212 assembly While the first two container 12 and carrier 212 assemblies are being processed in the first process chamber 400, the door assembly 404 on the second process chamber 400 is opened to allow the robot 300 access to the receptacles 442 of the second process chamber 400. Each receptacle 442 of the second process chamber 400 contains an empty carrier 212. The robot 300 utilizes the second end effector 308 to remove one of the empty carriers 212 from the first receptacle and return it to the first station 216 of the carrier assembly 200, which is vacant. The rotor 410 is then rotated approximately 180 degrees to expose the second receptacle 442 (which contains an empty carrier 212). The robot 300 utilizes the second end effector 308 to remove the empty carrier 212 from the second receptacle and return it to the second station 216 of the carrier assembly 200, which is vacant. Next, the robot 300 engages a third, dirty container 12 and carrier 212 combination with the second end effector 308 and loads it into the second receptacle 442 of the rotor 410 of the second process chamber 200. The rotor 410 is then rotated approximately 180 degrees to expose the first receptacle 442. The robot 300 utilizes the second end effector 308 to engage the fourth, dirty container 12 and carrier 212 assembly. Once properly aligned, the robot 300 inserts the fourth dirty container 12 and carrier 212 combination into the first receptacle 442 of the second process chamber 400. The door assembly 404 is closed for the processing to commence in the second process chamber 400.

Alternatively, the robot 300 may be programmed to load the process chambers 400 in a different manner. For example, after the robot 300 unloads the empty carrier 212 from the first receptacle 442 (of either the first or second process chamber 400), the robot 300 loads the third dirty container 12 and carrier 212 combination into the now vacant first receptacle 442. The rotor 410 is then rotated approximately 180 degrees to expose the second receptacle 442 containing the empty second carrier 212. After the robot 300 unloads the second carrier 212 and places it at the second carrier station 216, the robot 300 engages the fourth container 12 and loads it into the second receptacle 442 to complete the loading of the second process chamber 400.

While the processing is ongoing in both the first and second process chambers 400, two dirty containers 12 are delivered to the carriers 212 located in the first and second stations 216 of the carrier assembly 200. After the first process chamber 400 has completed its cleaning and drying steps, the robot 300 unloads the first two container 12 and carrier 212 assemblies from the receptacles 442 and delivers them to the vacant third and fourth carrier stations 216, respectively. The robot 300 utilizes the first end effector 306 to engage the door 12b and reassemble the container 12. After reassembly, the processed containers 12 exit the apparatus 10 via the load port assembly 100 and are returned to service. The above steps are repeated wherein two dirty containers 12 are loaded into the apparatus 10, and two clean containers 12 are returned to service. As a result, the first and second process chambers 400 operate in an overlapping fashion to provide continuous processing of containers 12. Consistent with the foregoing operational disclosure and depending upon the end-user's processing requirements, the apparatus 10 can be configured to include additional process chambers 400 and/or carrier stations 216.

While the specific embodiments have been illustrated and described, numerous modifications come to mind without significantly departing from the spirit of the invention, and the scope of protection is only limited by the scope of the accompanying Claims.

What is claimed is:

1. An apparatus for cleaning a container for semiconductor workpieces, the apparatus comprising:
    a deck assembly having a carrier that removably receives the container;
    a robot having an actuator arm configured to remove a door of the container and place said door into engagement with a segment of the carrier;
    a process chamber having a rotor that is rotated to create both high pressure and low pressure areas, the rotor having a receptacle configured to receive the container and being movable between a loading position wherein the robot loads the container into the receptacle, a processing position wherein the container is cleaned and then dried, and an unloading position wherein the robot unloads the container from the receptacle.

2. The cleaner apparatus of claim 1, further comprising a load port that supplies containers to and receives containers from the deck assembly, the load port having a fixture that transports a container between the load port and the deck assembly carrier.

3. The cleaner apparatus of claim 2, wherein the load port has a frame assembly, the fixture movable between a front portion and a rear portion of the frame assembly to transport the container to the deck assembly carrier.

4. The cleaner apparatus of claim 1, further comprising a load port that supplies containers to and receives containers from the deck assembly, wherein the load port is positioned exterior to a cleaner enclosure defined by a side wall arrangement.

5. The cleaner apparatus of claim 4, wherein the cleaner enclosure has an access door and the load port supplies and receives containers through the access door to the deck assembly.

6. The cleaner apparatus of claim 5, wherein the internal receiver has at least one pin that is received by an opening in a bottom wall of the container.

7. The cleaner apparatus of claim 1, wherein the process chamber includes means for cleaning the container, said cleaning means includes a manifold positioned in a sidewall of the process chamber to direct a first processing fluid radically inward and onto the container while the rotor is rotating.

8. The cleaner apparatus of claim 7, wherein the process chamber includes means for drying the container, said drying means includes an air duct that delivers warm air to the receptacle.

9. The cleaner apparatus of claim 8, wherein the air duct includes a primary duct affixed to the process chamber and a secondary duct affixed to a face plate of the process chamber, the primary and second ducts being aligned to deliver warm air to a central portion of the rotor and across the container.

10. The cleaner apparatus of claim 8 wherein a lower portion of the process chamber includes a discharge element configured to drain excess liquid solution from the cleaning means and to exhaust air from the drying means. and then dried, and an unloading position wherein the robot unloads the container from the receptacle.

11. An apparatus for cleaning a container for semiconductor workpieces, the apparatus comprising:
a deck assembly having a carrier that removably receives the container wherein the deck assembly carrier has a frame arrangement that defines an internal receiver for the container, wherein the frame arrangement defines an upper receiver that receivably secures the container door positioned by the robot, the upper receiver having at least one latch that engages the door for securement;
a robot having an actuator arm configured to remove a door of the container and place said door into engagement with a segment of the carrier;
a process chamber having a rotor that is rotated to create both high pressure and low pressure areas, the rotor having a receptacle conflaured to receive the container and being movable between a loading position wherein the robot loads the container into the receptacle, a processing position wherein the container is cleaned and then dried, and an unloading position wherein the robot unloads the container from the receptacle.

12. The cleaner apparatus of claim 11, wherein the arm engages an inner surface of the container door when the door is secured by the upper receiver, whereby the inner door surface is exposed for subsequent cleaning.

13. An apparatus for cleaning a container for semiconductor workpieces. the apparatus comprising:
a deck assembly having a carrier that removably receives the container;
a robot having an actuator arm configured to remove a door of the container and place said door into engagement with an under segment of the carrier wherein the robot actuator arm has a first end effector that removes the container door and pivots the door into engagement with the upper segment of the carrier;
a process chamber having a rotor that is rotated to create both high pressure and low pressure areas, the rotor having a receptacle configured to receive the container and being movable between a loading position wherein the robot loads the container into the receptacle, a processing position wherein the container is cleaned and then dried, and an unloading position wherein the robot unloads the container from the receptacle.

14. The cleaner apparatus of claim 13 wherein the first end effector includes a plate with at least one projection that is inserted into an opening in the door to remove the door from the container.

15. The cleaner apparatus of claim 13, wherein the actuator arm pivots the door approximately 270 degrees to bring the door into engagement with the upper carrier segment.

16. The cleaner apparatus of claim 13 wherein the pivoting of the door by the first end effector into engagement with the upper carrier segment exposes an inner surface of the door.

17. The cleaner apparatus of claim 16 wherein the actuator arm has a second end effector that engages the carrier to permit the actuator arm to elevate the carrier to a pre-loading position wherein the carrier is ready for loading into the process chamber rotor.

18. The cleaner apparatus of claim 17 wherein the actuator arm moves the carrier from the pre-loading position into the receptacle of the process chamber rotor, wherein the container internals are visible from above and an inner surface of the door is directed towards the robot.

19. The cleaner apparatus of claim 18 wherein the actuator arm pivots the carrier approximately 90 degrees during movement from the pre-loading position.

20. An apparatus for cleaning containers for semiconductor workpieces, the apparatus comprising:
a load port assembly having a fixture that engages the container for further processing within the apparatus;
a deck assembly having a pair of carriers, wherein each carrier has a frame arrangement that removably secures a single container;
a robot movable along the deck assembly to engage a container while it is secured by the carrier, the robot having an actuator arm that removes a door of the container and places said door into secured engagement with a segment of the frame arrangement;
a process chamber having a rotor with a first container receptacle, a second container receptacle, a cleaner element, and a dryer element, the rotor being movable between
a first loaded position wherein the first receptacle receives a first one of the containers,
a second loaded position wherein the second receptacle receives a second one of the containers,
a processing position wherein the rotor is rotated to create a high pressure region and a low pressure region for cleaning and drying of the containers, a first unloading position wherein the robot removes the first one of the containers from the first receptacle; and,
a second unloading position wherein the robot removes the second one of the containers from the second receptacle.

21. The cleaner apparatus of claim 20, wherein the fixture is cooperatively dimensioned with a base portion of the container to facilitate engagement between the fixture and the container.

22. The cleaner apparatus of claim 20, wherein the cleaner apparatus has a side wall arrangement that defines an enclosure with an access door, the load port assembly being positioned to supply and receive containers through the access door.

23. The cleaner apparatus of claim 20, wherein the carrier frame arrangement defines an internal receiver that removably receives a container.

24. The cleaner apparatus of claim 20. wherein the robot actuator arm has a first end effector with a plate that removes the container door and rotates the door into engagement with the upper segment of the carrier.

25. The cleaner apparatus of claim 24, wherein the first end effector rotates the door approximately 270 degrees to bring the door into engagement with the upper carrier segment, whereby an inner surface of the door is exposed.

26. The cleaner apparatus of claim 20, wherein the actuator arm has a second end effector with a clamp to engage the carrier, the engagement permitting the actuator arm to elevate and rotate both the carrier and the container for loading into the process chamber rotor.

27. The cleaner apparatus of claim 26, wherein in the first loaded position, the actuator arm inserts the carrier and the container into the first receptacle.

28. The cleaner apparatus of claim 27, wherein the rotor is rotated approximately 180 degrees to the second loading position wherein the actuator inserts the carrier and the container into the second receptacle.

29. The cleaner apparatus of claim 28, wherein in the second loaded position, the second receptacle is positioned above the first receptacle.

30. The cleaner apparatus of claim 20, wherein the cleaner element includes a manifold in fluid communication with a supply reservoir to direct a first processing fluid radically inward and into the rotor during rotation.

31. The cleaner apparatus of claim 20, wherein the dryer element includes an air duct oriented to deliver warm air into a central portion of the rotor during rotation.

32. The cleaner apparatus of claim 20, wherein a lower portion of the process chamber includes a discharge element configured to drain excess processing fluid from the cleaner element and to exhaust air from the dryer element.

33. An apparatus for cleaning containers for semiconductor workpieces, the apparatus comprising:
- a load port assembly having a fixture that engages the container for further processing within the apparatus;
- a deck assembly having a pair of carriers, wherein each carrier has a frame arrangement defining an internal receiver that removably receives and secures a single container, and wherein the frame arrangement defines an upper receiver that receivably secures the container door positioned by the robot, the upper receiver having at least one latch that engages the door for securement;
- a robot movable along the deck assembly to engage a container while it is secured by the carrier, the robot having an actuator arm that removes a door of the container and places said door into secured engagement with a segment of the frame arrangement;
- a process chamber having a rotor with a first container receptacle, a second container receptacle, a cleaner element, and a dryer element, the rotor being movable between
  - a first loaded position wherein the first receptacle receives a first one of the containers,
  - a second loaded position wherein the second receptacle receives a second one of the containers,
  - a processing position wherein the rotor is rotated to create a high pressure region and a low pressure region for cleaning and drying of the containers,
  - a first unloading position wherein the robot removes the first one of the containers from the first receptacle: and,
  - a second unloading position wherein the robot removes the second one of the containers from the second receptacle.

34. The cleaner apparatus of claim 33, wherein the upper receiver latch engages an inner surface of the container door when the door is secured by the upper receiver, whereby the inner door surface is exposed for subsequent cleaning.

35. An apparatus for cleaning a container for holding semiconductor workpieces, the apparatus comprising:
- a carrier having container holding means for holding a container and door holding means for holding a container door;
- a process chamber having a rotor including at least two receptacles, with each receptable adapted to hold a carrier;
- a robot including means for detaching a container door from a container and for placing the container door onto the carrier, and the robot also including means for moving the carrier into a receptacle of the rotor.

* * * * *